(12) United States Patent
Hiratsuka

(10) Patent No.: US 12,666,746 B2
(45) Date of Patent: Jun. 23, 2026

(54) SOLID-STATE IMAGING DEVICE, MANUFACTURING METHOD OF SOLID-STATE IMAGING DEVICE, AND ELECTRONIC APPARATUS

(71) Applicant: SONY SEMICONDUCTOR SOLUTIONS CORPORATION, Kanagawa (JP)

(72) Inventor: Tatsumasa Hiratsuka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 349 days.

(21) Appl. No.: 18/556,914

(22) PCT Filed: Mar. 16, 2022

(86) PCT No.: PCT/JP2022/011774
§ 371 (c)(1),
(2) Date: Oct. 24, 2023

(87) PCT Pub. No.: WO2022/239464
PCT Pub. Date: Nov. 17, 2022

(65) Prior Publication Data
US 2024/0204030 A1 Jun. 20, 2024

(30) Foreign Application Priority Data
May 13, 2021 (JP) ................................. 2021-082009

(51) Int. Cl.
*H10F 39/00* (2025.01)
*H10F 39/12* (2025.01)
(52) U.S. Cl.
CPC ......... *H10F 39/811* (2025.01); *H10F 39/024* (2025.01); *H10F 39/199* (2025.01); *H10F 39/804* (2025.01)

(58) Field of Classification Search
CPC .... H10F 39/811; H10F 39/024; H10F 39/199; H10F 39/804; H10F 39/12
See application file for complete search history.

(56) References Cited

U.S. PATENT DOCUMENTS 11,647,300 B2 * 5/2023 Mun ...................... H04N 25/76
348/294
2003/0054583 A1 3/2003 Waldman et al.
(Continued)

FOREIGN PATENT DOCUMENTS

JP 2001-085655 A 3/2001
JP 2005-101332 A 4/2005
(Continued)

OTHER PUBLICATIONS

International Search Report and Written Opinion of PCT Application No. PCT/JP2022/011774, issued on Jun. 14, 2022, 10 pages of ISRWO.

*Primary Examiner* — Sue A Purvis
*Assistant Examiner* — Marc-Anthony Armand
(74) *Attorney, Agent, or Firm* — CHIP LAW GROUP

(57) ABSTRACT

An object is to provide a solid-state imaging device, a manufacturing method of a solid-state imaging device, and an electronic apparatus that are capable of reducing tensile stress produced between a covering film and a semiconductor element which is joined to a solid-state imaging element and which is covered with the covering film, and that allow transistors to be provided near chip ends. There is provided a configuration including a solid-state imaging element, a semiconductor element laminated on the solid-state imaging element and electrically connected to the solid-state imaging element, and a covering film that covers a non-lamination portion that is a region where the semiconductor element is not laminated, in a laminated surface of the solid-state imaging element where the semiconductor element is lami- (Continued)

nated, and further covers a peripheral side surface of the semiconductor element and forms a clearance between the peripheral side surface of the semiconductor element and the covering film. This configuration can reduce tensile stress produced at chip ends of the semiconductor element when a covering film such as an oxide film is formed on the non-lamination portion of the solid-state imaging element and on an entire surface including the peripheral side surface of the semiconductor element on a side opposite to a lamination surface.

26 Claims, 11 Drawing Sheets

(56) References Cited

U.S. PATENT DOCUMENTS

2008/0157312 A1* 7/2008 Yang ..................... H10F 39/804
257/678
2011/0210413 A1* 9/2011 Huang ................ H01L 23/3114
257/E31.032

FOREIGN PATENT DOCUMENTS

| | | | |
|----|----------------|----|--------|
| JP | 2009-010352 | A | 1/2009 |
| JP | 2012-159395 | A | 8/2012 |
| JP | 2013-520808 | A | 6/2013 |
| WO | 2011/108156 | A1 | 9/2011 |
| WO | 2019/087764 | A1 | 5/2019 |

* cited by examiner

FIG. 1A
FIG. 1B
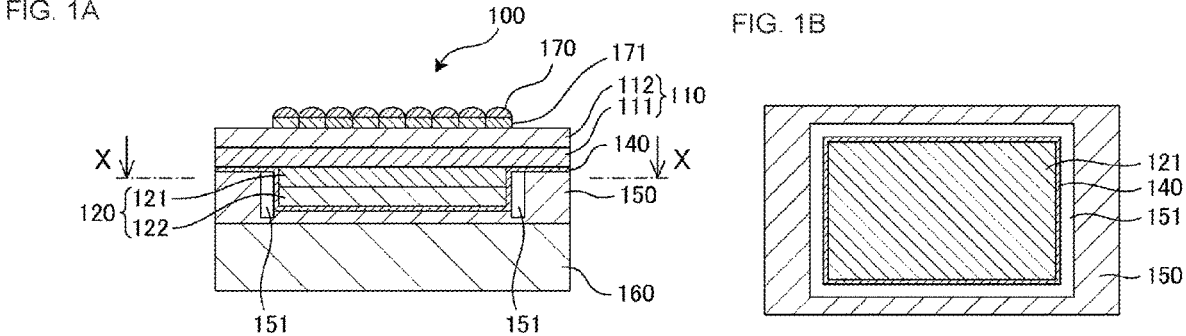
FIG. 2A
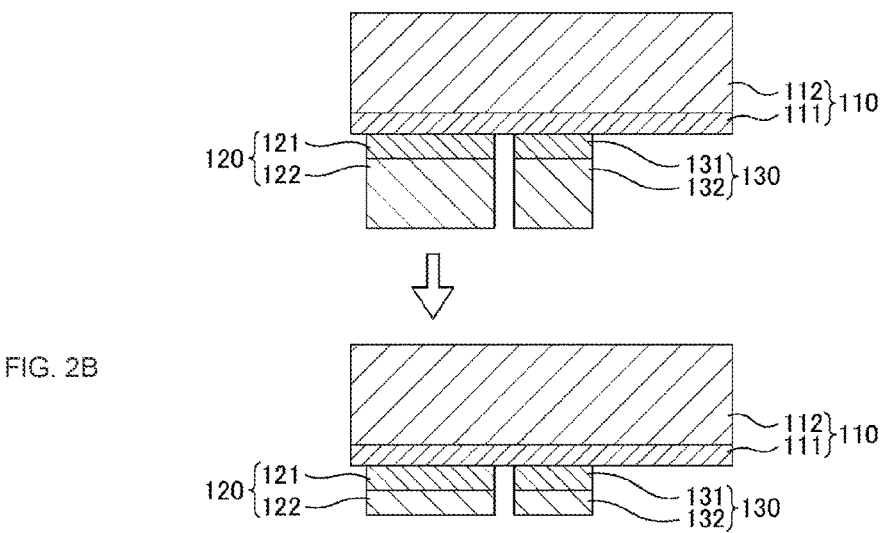
FIG. 2B

F I G . 6
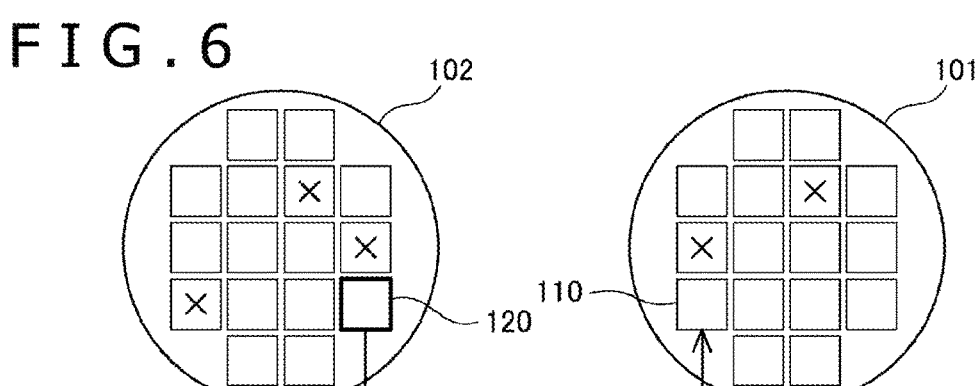
F I G . 7
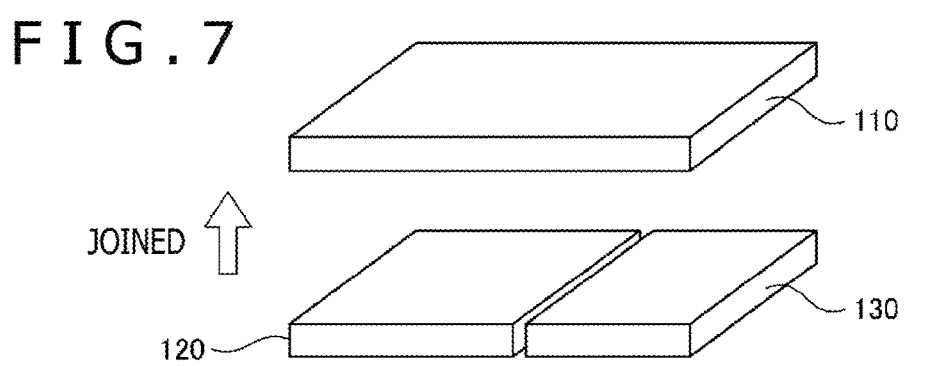
JOINED
F I G . 8
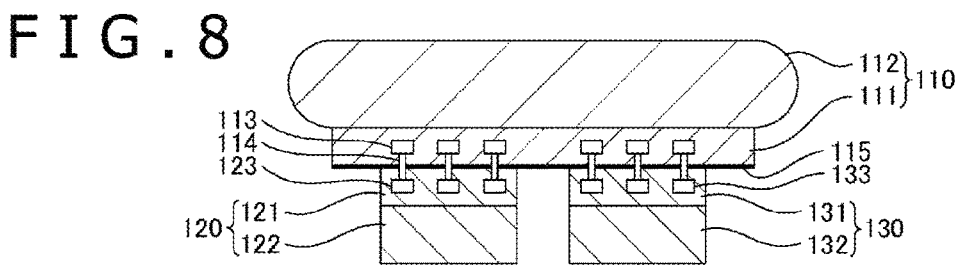
F I G . 9
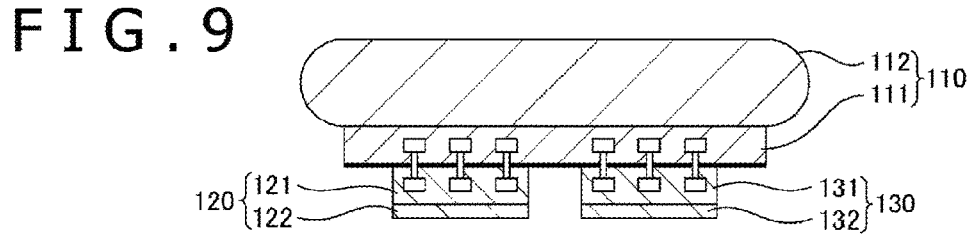
F I G . 1 0
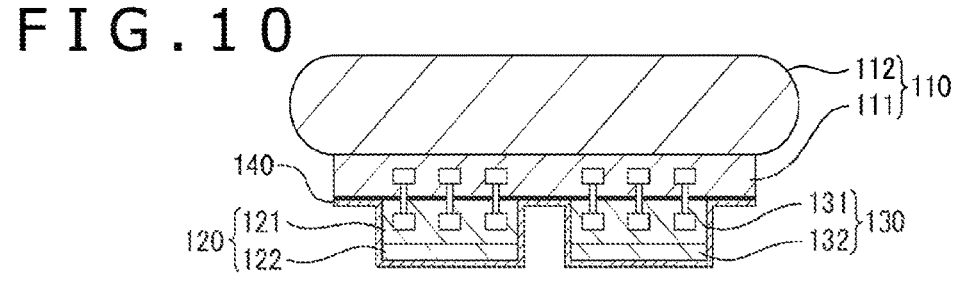

FIG. 15
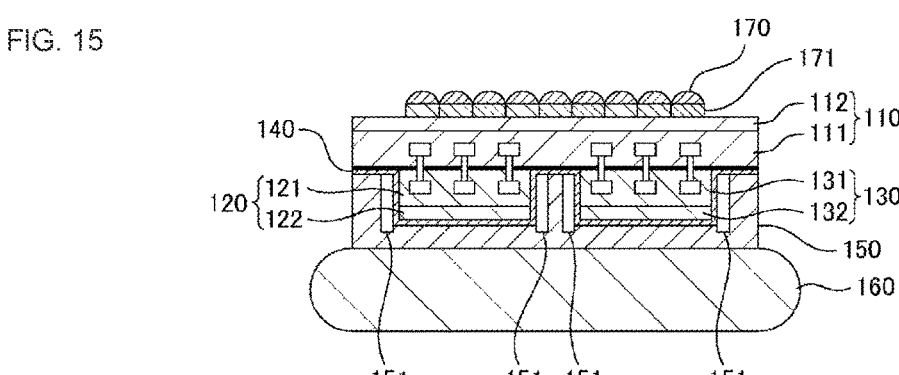
FIG. 16A
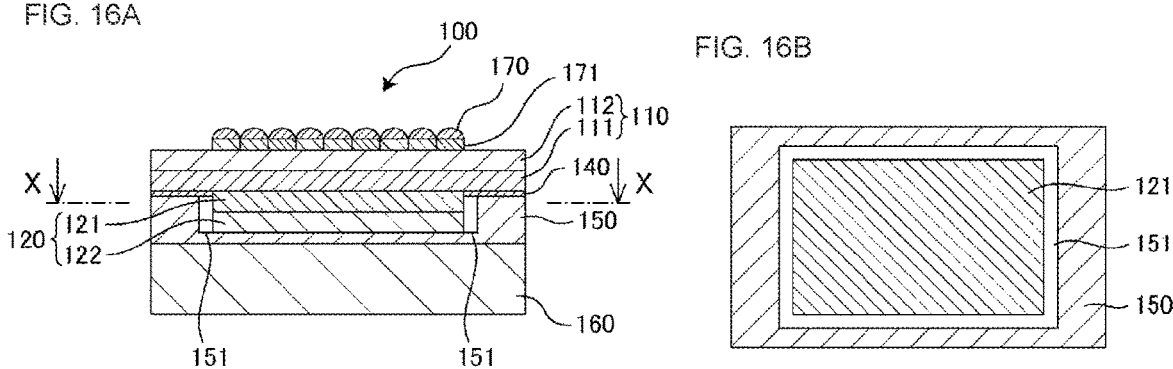
FIG. 16B
FIG. 17A
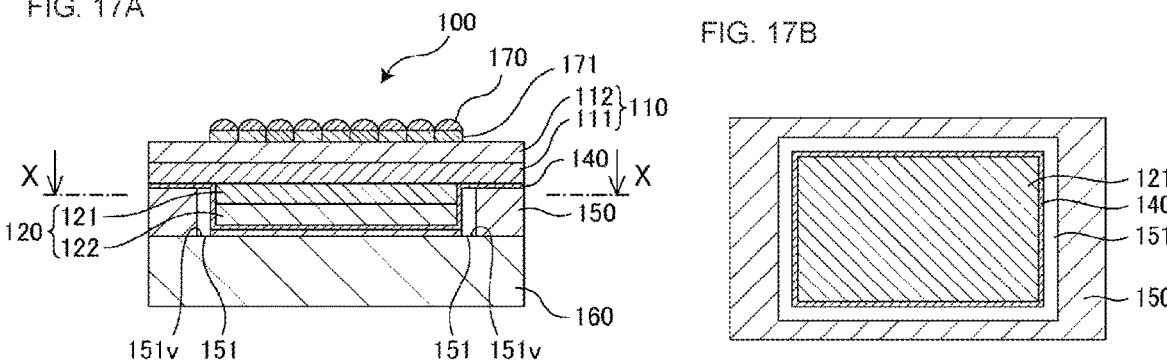
FIG. 17B
FIG. 18A
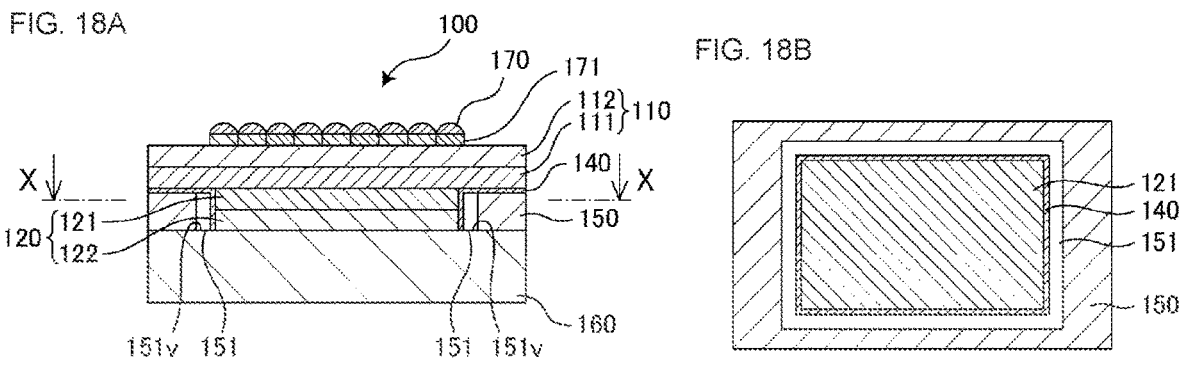
FIG. 18B FIG. 23A
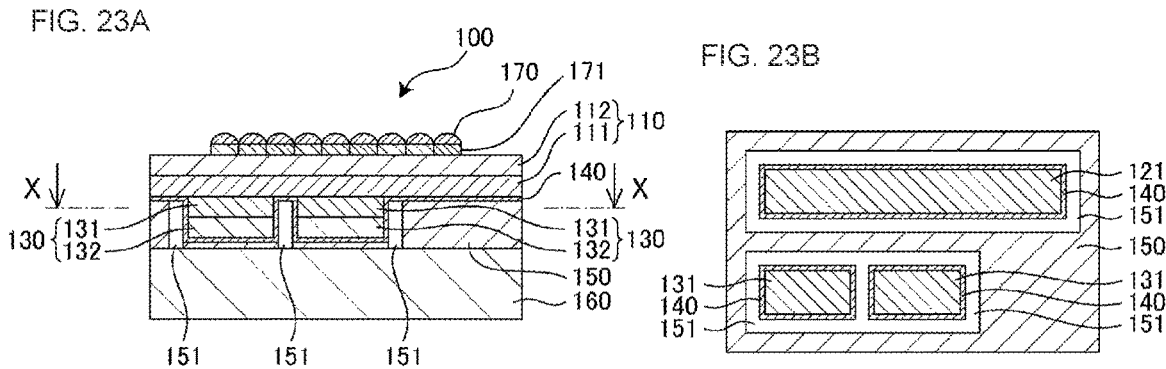
FIG. 23B
FIG. 24
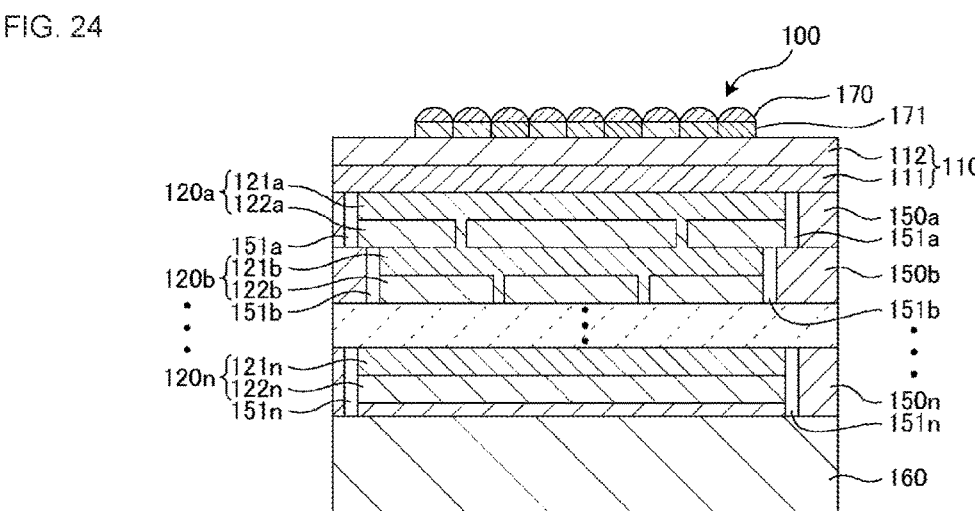
FIG. 25
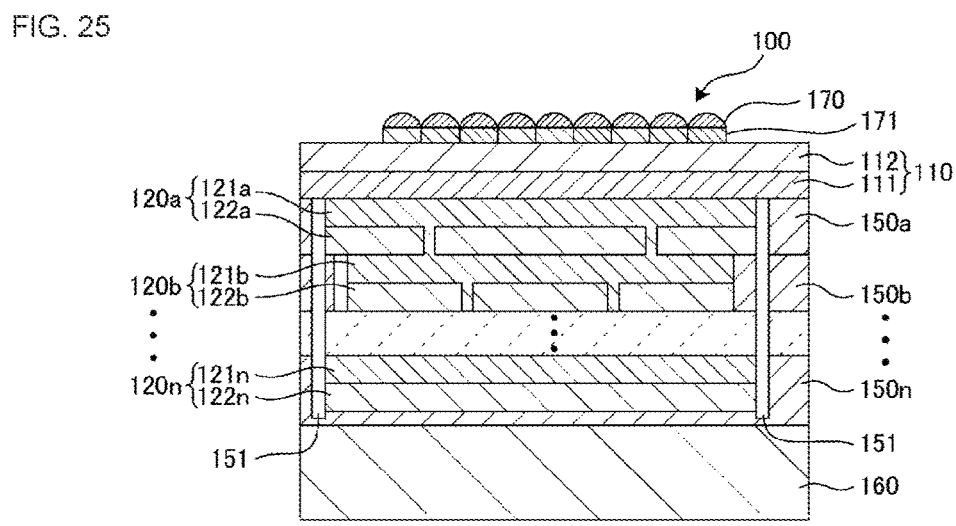

F I G . 2 8
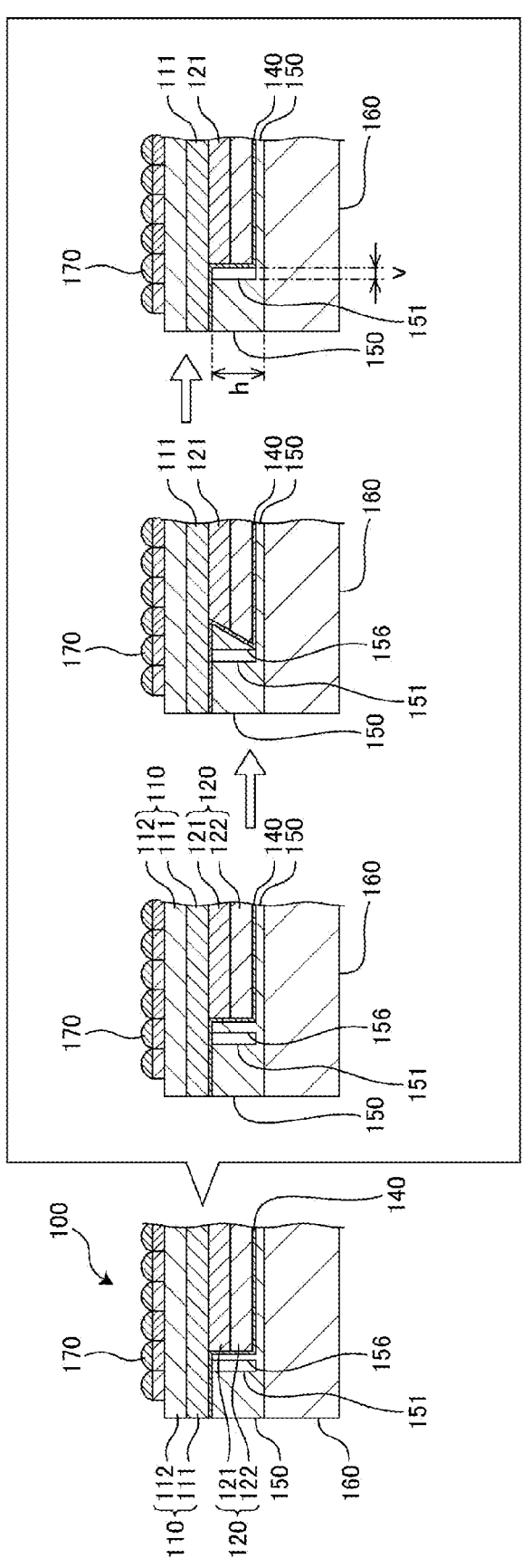

SOLID-STATE IMAGING DEVICE, MANUFACTURING METHOD OF SOLID-STATE IMAGING DEVICE, AND ELECTRONIC APPARATUS

CROSS REFERENCE TO RELATED APPLICATIONS

This application is a U.S. National Phase of International Patent Application No. PCT/JP2022/011774 filed on Mar. 16, 2022, which claims priority benefit of Japanese Patent Application No. JP 2021-082009 filed in the Japan Patent Office on May 13, 2021. Each of the above-referenced applications is hereby incorporated herein by reference in its entirety.

TECHNICAL FIELD

The present disclosure chiefly relates to a back-illuminated solid-state imaging device, a manufacturing method of a back-illuminated solid-state imaging device, and an electronic apparatus, and particularly to a solid-state imaging device, a manufacturing method of a solid-state imaging device, and an electronic apparatus that enable reduction of manufacturing costs.

BACKGROUND ART

High integration and high performance of a semiconductor element have conventionally been achieved by miniaturization of transistors and wires. However, acceleration of this miniaturization causes a problem of a rise of development and manufacturing costs. Accordingly, there has been promoted in recent years such development which increases integration and performance of a semiconductor element by three-dimensionally laminating dies and packages for an integrated circuit which have different functions and which are manufactured by respective optimum processes.

For example, CoW (Chip on Wafer) and CoC (Chip on Chip) for directly joining a chip to a wafer or a chip have been developed as a joining technology which achieves cost reduction of a sensor for a large-sized camera and which allows mounting of a mixture of chips of logic circuits and chips of memory circuits of multiple types. Specifically, CoW connects a good chip (KGD: Known Good Die), such as a logic circuit manufactured and inspected in a different step, to a chip inspected and determined as a good chip on a wafer of a solid-state imaging element, by Cu—Cu (copper-copper) connection to laminate these chips.

Cu—Cu connection directly connects a chip of a solid-state imaging element to a chip of a memory circuit or a chip of a logic circuit, for example, via Cu terminals formed on respective lamination surfaces of these chips. In this configuration, the chip of the solid-state imaging element need not have a TSV (Through Silicon Via) or the like penetrating therethrough, and a dedicated region for connection need not be provided. Accordingly, size reduction and productivity improvement of a solid-state imaging device are achievable.

However, for three-dimensionally integrating dies and packages of an integrated circuit, the thickness of a substrate needs to be reduced. This necessity causes problems such as insufficient mechanical strength and a warp produced by stress due to the insufficient mechanical strength. Accordingly, there have still been issues to be solved, such as improvement of manufacturing yields, securing of characteristics of products, and enhancement of reliability.

Under these circumstances, PTL 1 has been disclosed as a related-art technology for preventing insufficient mechanical strength, generation of a warp by stress, and the like, which are associated with reduction in thickness of a substrate.

PTL 1 discloses a back-illuminated solid-state imaging device which includes a first semiconductor element having an imaging element for generating a pixel signal for each pixel, a second semiconductor element having a signal processing circuit which is necessary for signal processing of the pixel signal and which is covered with (embedded in) a covering film (filling member), and a wire electrically connecting the first semiconductor element and the second semiconductor element. The first semiconductor element and the second semiconductor element are laminated by oxide film joining.

Specifically, a memory circuit element and a logic circuit element are singulated and disposed in a horizontal direction on a wafer of a back-illuminated solid-state imaging element, and connected to each other by Cu—Cu connection. Subsequently, each of the memory circuit element and the logic circuit element is made thinner and covered with an oxide film, and the covering film is flattened. Thereafter, joining to a support substrate is achieved, the solid-state imaging element is made thinner, and a color filter and a micro-lens array are mounted on a light receiving side surface of the solid-state imaging element to manufacture the solid-state imaging element.

CITATION LIST

Patent Literature

PTL 1

PCT Patent Publication No. WO2019/087764

SUMMARY

Technical Problems

According to the technology disclosed in PTL 1, however, chips are heated to a high temperature during formation and covering of the oxide film. Hence, the chips are expanded, and are covered with and fixed by the covering film in the expanded state. Therefore, a force in a shrinking direction is generated in cooled chips. However, in the state where the chips are fixed by the oxide film, tensile stress is produced in the chips. As a result, there occurs such a phenomenon which changes characteristics of transistors provided at chip ends where the tensile stress is produced. To cope with this phenomenon, a KOZ (Keep out zone) is set in a predetermined range from each of the chip ends. However, there is a problem that transistor circuits are not providable within this KOZ. Moreover, a problem of alignment deviation is caused when the micro-lens array is provided on the light reception side of the solid-state imaging element.

The present disclosure has been developed in consideration of the above-described problems. It is an object of the present disclosure to provide a solid-state imaging device, a manufacturing method of a solid-state imaging device, and an electronic apparatus that are capable of reducing tensile stress produced between a covering film and a chip which is joined to a solid-state imaging element and which is covered with the covering film, and that allow transistors to be provided near chip ends.

Solution to Problems

The present disclosure has been developed to solve the above-described problems. A first aspect of the present disclosure is directed to a solid-state imaging device including a solid-state imaging element, a semiconductor element laminated on the solid-state imaging element and electrically connected to the solid-state imaging element, and a covering film that covers a non-lamination portion that is a region where the semiconductor element is not laminated, in a laminated surface of the solid-state imaging element where the semiconductor element is laminated, and further covers a peripheral side surface of the semiconductor element and forms a clearance between the peripheral side surface of the semiconductor element and the covering film.

In addition, according to the first aspect, there may be provided a protection film on the non-lamination portion of the solid-state imaging element and on an entire surface including the peripheral side surface of the semiconductor element on a side opposite to a lamination surface.

In addition, according to the first aspect, there may be provided a protection film on the non-lamination portion of the solid-state imaging element.

In addition, according to the first aspect, there may be provided a protection film on the non-lamination portion of the solid-state imaging element and on the peripheral side surface of the semiconductor element.

In addition, according to the first aspect, electric connection between the solid-state imaging element and the semiconductor element may be Cu—Cu connection.

In addition, according to the first aspect, a support substrate may be joined via the covering film to a non-light receiving side of the laminated solid-state imaging element and semiconductor element.

In addition, according to the first aspect, joining between the covering film and the support substrate may be semiconductor direct joining.

In addition, according to the first aspect, the clearance formed in the covering film may make contact with a support substrate.

In addition, according to the first aspect, the clearance formed in the covering film may include a thin oxide film between an upper end of the clearance and a lower surface of a wiring layer of the solid-state imaging element.

In addition, according to the first aspect, the clearance formed in the covering film may have a substantially rectangular cross section.

In addition, according to the first aspect, the clearance formed in the covering film may have a substantially V-shaped cross section.

In addition, according to the first aspect, a thin film of the covering film may be formed between the clearance and the protection film.

In addition, according to the first aspect, the clearance formed in the covering film may have an aspect ratio of $1/50$ or higher.

In addition, according to the first aspect, the clearance formed in the covering film may be filled with a film formable at a low temperature or a film having a low Young's modulus.

In addition, according to the first aspect, the film formable at a low temperature may be an organic film.

In addition, according to the first aspect, the film having a low Young's modulus may include a film that contains at least any one of silicon dioxide ($SiO_2$), silicon nitride ($Si_3N_4$), silicon carbide (SiC), copper (Cu), aluminum (Al), or carbon (C) each of which is porous and used as a low-k material, or include an organic film.

In addition, according to the first aspect, two or more of the semiconductor elements may be provided on a lower surface of the solid-state imaging element in a horizontal direction.

In addition, according to the first aspect, the two or more semiconductor elements provided in the horizontal direction may have the one clearance between the semiconductor elements.

In addition, according to the first aspect, two or more of the semiconductor elements may be laminated in a vertical direction on a lower surface of the solid-state imaging element.

In addition, according to the first aspect, the clearance may be formed on an entire peripheral side surface of the two or more semiconductor elements laminated in the vertical direction.

In addition, according to the first aspect, the covering film may be an inorganic oxide film or an organic film.

In addition, according to the first aspect, a heat dissipation member having predetermined heat conductivity may be laminated on a non-light receiving side of the semiconductor element via the covering film.

In addition, according to the first aspect, the heat dissipation member may contain at least any one of silicon carbide (SiC), aluminum nitride (AlN), silicon nitride ($Si_3N_4$), copper (Cu), aluminum (Al), or carbon (C).

A second aspect of the present disclosure is directed to a manufacturing method of a solid-state imaging device, the method including a step of joining a wiring layer of a solid-state imaging element and a wiring layer of a semiconductor element and electrically connecting the respective wiring layers, a step of thinning a silicon layer of the semiconductor element, a step of forming a protection film on a non-lamination portion that is a region where the semiconductor element is not laminated, in a laminated surface of the solid-state imaging element where the semiconductor element is laminated, and on a surface including a peripheral side surface of the semiconductor element on a side opposite to a lamination surface, a step of covering the protection film with a covering film and flattening the covering film, a step of removing the covering film on the peripheral side surface of the semiconductor element to form a clearance, a step of covering an opening of the clearance with a covering film and flattening the covering film, a step of joining a support substrate to the covering film, and a step of carrying out packaging.

In addition, according to the second aspect, the step of covering the opening of the clearance with the covering film and flattening the covering film may include a step of forming a temporary filling film within the clearance after formation of the clearance, and a step of removing the temporary filling film and a step of flattening the covering film after the opening of the clearance is covered with the covering film.

A third aspect of the present disclosure is directed to an electronic apparatus including a solid-state imaging device that includes a solid-state imaging element, a semiconductor element laminated on the solid-state imaging element and electrically connected to the solid-state imaging element, and a covering film that covers a non-lamination portion that is a region where the semiconductor element is not laminated, in a laminated surface of the solid-state imaging element where the semiconductor element is laminated, and further covers a peripheral side surface of the semiconductor element and forms a clearance between the peripheral side surface of the semiconductor element and the covering film.

By adopting the aspects described above, a clearance or a buffer film is formed between the covering film and a chip that is joined to the solid-state imaging element and that is covered with the covering film. In this manner, these aspects can provide a solid-state imaging device, a manufacturing method of a solid-state imaging device, and an electronic apparatus that are each capable of reducing tensile stress produced by the covering film and that allow transistors to be disposed near chip ends.

BRIEF DESCRIPTION OF DRAWINGS

FIGS. 1A and 1B are explanatory diagrams of a configuration example of a solid-state imaging device according to a first embodiment of the present disclosure.

FIGS. 2A and 2B are step explanatory diagrams explaining a principle of the solid-state imaging device according to the present disclosure (1).

FIG. 6 is an explanatory diagram of lamination of layers in the solid-state imaging device according to the present disclosure (1).

FIG. 7 is an explanatory diagram of lamination of layers in the solid-state imaging device according to the present disclosure (2).

FIG. 8 is an explanatory diagram of a manufacturing method of the solid-state imaging device according to the first embodiment of the present disclosure (1).

FIG. 9 is an explanatory diagram of the manufacturing method of the solid-state imaging device according to the first embodiment of the present disclosure (2).

FIG. 10 is an explanatory diagram of the manufacturing method of the solid-state imaging device according to the first embodiment of the present disclosure (3).

FIG. 15 is an explanatory diagram of the manufacturing method of the solid-state imaging device according to the first embodiment of the present disclosure (8).

FIGS. 16A and 16B are explanatory diagrams of a configuration example of a solid-state imaging device according to a second embodiment of the present disclosure.

FIGS. 17A and 17B are explanatory diagrams of a configuration example of a solid-state imaging device according to a third embodiment of the present disclosure.

FIGS. 18A and 18B are explanatory diagrams of a configuration example of a solid-state imaging device according to a fourth embodiment of the present disclosure.

FIGS. 23A and 23B are explanatory diagrams of a configuration example of a solid-state imaging device according to a ninth embodiment of the present disclosure.

FIG. 24 is an explanatory diagram of a configuration example of a solid-state imaging device according to a tenth embodiment of the present disclosure.

FIG. 25 is an explanatory diagram of a configuration example of a solid-state imaging device according to an eleventh embodiment of the present disclosure.

FIG. 28 is an explanatory diagram of a configuration example of the solid-state imaging device according to the twelfth embodiment of the present disclosure (3).

DESCRIPTION OF EMBODIMENTS

Figure 3A:
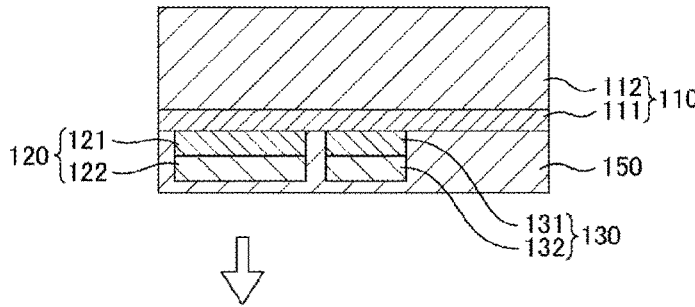
FIGS. 3A, 3B, and 3C are step explanatory diagrams explaining the principle of the solid-state imaging device according to the present disclosure (2).

Modes for carrying out the present disclosure (hereinafter referred to as "embodiments") will be now described in the following order with reference to the figures. In the figures referred to hereinafter, identical or similar parts will be given identical or similar reference signs. However, the figures are only schematic illustrations, and ratios of sizes and the like of the respective parts do not necessarily coincide with actual ones. Moreover, needless to say, size relations and ratios included in some of the figures are different from corresponding size relations and ratios included in the other figures.

1. Solid-state imaging device according to first embodiment of present disclosure
2. Manufacturing method of solid-state imaging device according to first embodiment of present disclosure
3. Solid-state imaging device according to second embodiment of present disclosure
4. Solid-state imaging device according to third embodiment of present disclosure
5. Solid-state imaging device according to fourth embodiment of present disclosure
6. Solid-state imaging device according to fifth embodiment of present disclosure
7. Solid-state imaging device according to sixth embodiment of present disclosure
8. Solid-state imaging device according to seventh embodiment of present disclosure 9. Solid-state imaging device according to eighth embodiment of present disclosure 10. Solid-state imaging device according to ninth embodiment of present disclosure 11. Solid-state imaging device according to tenth embodiment of present disclosure 12. Solid-state imaging device according to eleventh embodiment of present disclosure 13. Solid-state imaging device according to twelfth embodiment of present disclosure 14. Electronic apparatus including solid-state imaging device according to present disclosure

1. Solid-State Imaging Device According to First Embodiment of Present Disclosure Configuration Example of First Embodiment FIG. 1A is a side cross-sectional diagram of a solid-state imaging device 100 according to a first embodiment of the present disclosure, while FIG. 1B is a cross-sectional diagram taken along an X-X position. In FIG. 1A, a wiring layer 111 of a solid-state imaging element 110 and a wiring layer 121 of a semiconductor element 120 vertically face each other with the wiring layer 111 located on the upper side and the wiring layer 121 located on the lower side, and are joined to each other.

Specifically, the wiring layer 111 of the solid-state imaging element 110 and the wiring layer 121 of the semiconductor element 120 are laminated, electrically connected, and integrated into a substantially T-shaped cross section. In addition, a protection film 140 is formed on a non-lamination portion of a lamination surface of the solid-state imaging element 110 on the side where the semiconductor element 120 is laminated, and on an entire surface including a peripheral side surface of the semiconductor element 120 on the side opposite to the lamination surface. The protection film 140 is a film which protects a lower surface of the wiring layer 111 of the solid-state imaging element 110 from over-etching during etching from a lower part of an oxide film 150 for forming a clearance 151. Moreover, the protection film 140 is a film for preventing diffusion of metal from the wiring layer 111.

The oxide film 150 is formed on a lower surface of the protection film 140. Specifically, the wiring layer 111 of the solid-state imaging element 110 and the semiconductor element 120 are covered with the oxide film 150, which is a covering film, via the protection film 140. The covering film herein may be either an inorganic oxide film such as the oxide film 150, or an organic film.

In addition, the clearance 151 which has a substantially rectangular cross section vertically elongated is formed in the oxide film 150 between the peripheral side surface of the semiconductor element 120 and the oxide film 150 via the protection film 140. Further, a support substrate 160 is joined by oxide film joining to the lower part of the oxide film 150.

A color filter 171 and a micro-lens array 170 are mounted on a light receiving side surface of a silicon layer 112 of the solid-state imaging element 110. Packaging is carried out in this state to complete the solid-state imaging device 100. Note that a surface of the solid-state imaging element 110 on the side opposite to the lamination surface where the wiring layer 111 of the solid-state imaging element 110 and the wiring layer 121 of the semiconductor element 120 are electrically connected, i.e., the silicon layer 112 side of the solid-state imaging element 110 in the present figure, corresponds to the light receiving side, and that the wiring layer 111 side corresponds to a non-light receiving side (the same applies hereinafter).

The solid-state imaging device 100 according to the first embodiment of the present disclosure is configured such that the clearance 151, which has a substantially rectangular cross section vertically elongated, is formed in the oxide film 150 between the peripheral side surface of the semiconductor element 120 and the oxide film 150 as described above. Accordingly, this configuration can reduce tensile stress produced in the state where the oxide film 150 covers the solid-state imaging element 110 and the semiconductor element 120, and allows transistors to be provided also near chip ends. This configuration reduces a chip size of the semiconductor element 120, and therefore achieves cost reduction. This configuration further reduces a warp.

Presented herein will be further detailed explanation about a principle by which the configuration of the solid-state imaging device 100 according to the first embodiment of the present disclosure reduces tensile stress produced in the state where the oxide film 150 covers the solid-state imaging element 110 and the semiconductor element 120. (Principle of Tensile Stress Reduction)

FIGS. 2A, 2B, 3A, 3B, and 3C are explanatory diagrams of steps performed for the solid-state imaging device 100 by using CoW in a case where the clearance 151 is not formed. As depicted in FIG. 2A, wiring layers 121 and 131 for two singulated semiconductor elements 120 and 130, respectively, are joined to the wiring layer 111 of the solid-state imaging element 110 each in a manner of an electric circuit. The two semiconductor elements 120 and 130 herein have been manufactured by different semiconductor processes and confirmed as good products by inspection. Moreover, for example, the two semiconductor elements 120 and 130 are configured such that the semiconductor element 120 is a memory circuit element and that the semiconductor element 130 is a logic circuit element.

Subsequently, a silicon layer 122 of the semiconductor element 120 and a silicon layer 132 of the semiconductor element 130 both joined to the non-light receiving side of the solid-state imaging element 110 are flattened by chemical mechanical polishing (CMP: Chemical Mechanical Polisher (hereinafter referred to as "CMP")) or other methods to be made thinner as depicted in FIG. 2B.

Subsequently, the solid-state imaging element 110 and the semiconductor elements 120 and 130 joined and integrated with each other are heated to an oxide film forming temperature. As a result, the oxide film 150 as a covering film is formed, and the semiconductor elements 120 and 130 are covered with the oxide film 150 as depicted in FIG. 3A.

Figure 3B:
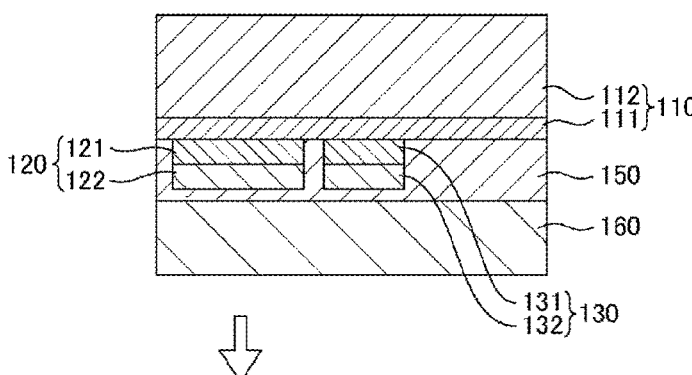

Subsequently, the covering oxide film 150 is flattened, and the support substrate 160 is joined by oxide film joining to the flattened oxide film 150 as depicted in FIG. 3B.

Figure 3C:
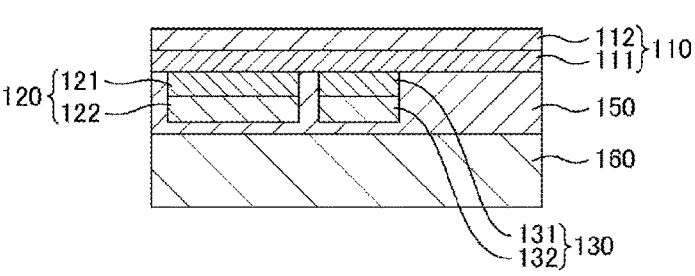

Subsequently, as depicted in FIG. 3C, the silicon layer 112 of the solid-state imaging element 110 is made thinner by CMP or the like. Thereafter, a color filter and a micro-lens array (not depicted) are mounted, and the solid-state imaging device 100 is completed by packaging.

Figure 4:
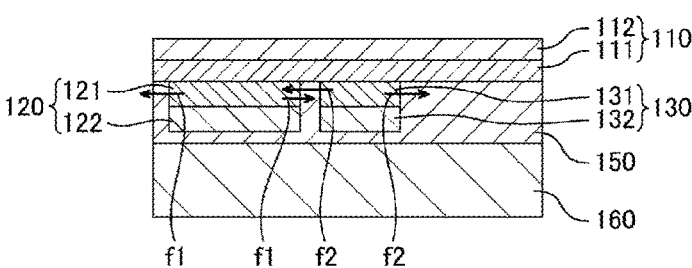
FIG. 4 is an explanatory diagram of the solid-state imaging device manufactured by steps in FIGS. 2A, 2B, 3A, 3B, and 3C.

In this case, however, the solid-state imaging element 110 and the semiconductor elements 120 and 130 are heated to approximately 350° C. when being covered with the oxide film 150. Accordingly, each of the semiconductor elements 120 and 130 is expanded, and covered with and fixed by the oxide film 150 in an expanded shape. Thereafter, the semiconductor elements 120 and 130 try to shrink in response to cooling. However, as depicted in FIG. 4, in the state where the semiconductor elements 120 and 130 are fixed by the oxide film 150, stresses f1 and stresses f2 are produced in a left-right direction in the semiconductor element 120 and the semiconductor element 130, respectively. Each of the stresses f1 and f2 acts as tensile stress.

As a result, as previously described, mobility of electrons and holes specifically changes by an influence of the stress at chip ends of the semiconductor elements 120 and 130, and characteristics of transistors provided at these chip ends change accordingly. In this case, circuits are not allowed to be provided near the chip ends. Moreover, alignment deviation is produced when the micro-lens array 170 is provided on the solid-state imaging element 110 side.

Figure 5:
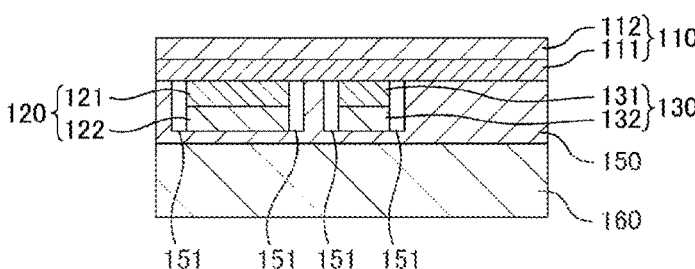
FIG. 5 is an explanatory diagram of a configuration example of the solid-state imaging device according to the present disclosure.

Meanwhile, when the clearance 151 or a buffer film 155 is formed between the peripheral side surfaces of the semiconductor elements 120 and 130 and the oxide film 150 as depicted in FIG. 5, the tensile stresses f1 and f2 produced by the oxide film 150 and acting on the semiconductor elements 120 and 130 can be reduced. In this manner, circuits are allowed to be provided near the chip ends. This is the principle of reduction of the tensile stresses f1 and f2 produced in the solid-state imaging device 100 according to the present disclosure.

Note that the specific configuration has been explained in [Configuration example of first embodiment] presented above.

2. Manufacturing Method of Solid-State Imaging Device According to First Embodiment of Present Disclosure FIG. 6 is an explanatory diagram depicting lamination of layers of the solid-state imaging device 100 by using CoW according to the present disclosure. Multiple chips of the solid-state imaging elements 110 are formed on a wafer 101 by a semiconductor process. In addition, as depicted in FIG. 6, singulated chips of the semiconductor elements 120, which are formed on a wafer 102 of the semiconductor elements 120 manufactured by a different semiconductor process and are confirmed as good products by inspection, are joined to the predetermined solid-state imaging elements 110 on the wafer 101. Note that "x" in the present figure indicates a defective product.

Moreover, FIG. 7 is a diagram depicting a state where the two chips in total, i.e., the semiconductor elements 120 and 130, are joined to the chip of the solid-state imaging element 110.

Hereinafter described with reference to FIGS. 8 to 15 will be an example of a manufacturing method of the solid-state imaging device 100 according to the present disclosure, where the two semiconductor elements in total, i.e., the semiconductor elements 120 and 130, are joined to the solid-state imaging element 110. As depicted in FIG. 8, the semiconductor elements 120 and 130 are joined to and integrated with the solid-state imaging element 110 into one body.

As depicted in FIG. 8, the wiring layer 111 of the solid-state imaging element 110 and the wiring layers 121 and 131 of the semiconductor elements 120 and 130 herein are joined to each other via an oxide film joining layer 115 formed on each of joining surfaces or either one of the joining surfaces of the respective wiring layers 111, 121, and 131. Specifically, the wiring layer 111 and the wiring layers 121 and 131 are joined to each other via the respective oxide film joining layers 115 or via the oxide film joining layer 115.

In a case where electric connection is made between the wiring layer 111 and the wiring layers 121 and 131 in this state, a TSV may be formed to extend from one of the wafers to the other wafer after the joining by the oxide film joining layer 115. In this manner, electric connection can be made between the solid-state imaging element 110 and the semiconductor elements 120 and 130.

Moreover, as depicted in FIG. 8, a Cu terminal 114 is extended from each of wiring patterns 113, 123, and 133 formed within the wiring layers 111, 121, and 131, respectively, toward the joining surface of the corresponding one of the wiring layers 111, 121, and 131, respectively. In addition, distal ends of the Cu terminals 114 facing each other may be exposed from the oxide film joining layer 115 and joined to each other by Cu—Cu joining. This configuration achieves electric connection between the solid-state imaging element 110 and the semiconductor elements 120 and 130.

The Cu—Cu joining in this manner eliminates a necessity of performing a step of forming a TSV, for example, and therefore shortens a cycle time and improves productivity. Moreover, a conductive portion is allowed to be provided immediately below a light reception element of the solid-state imaging element 110. Accordingly, this configuration reduces a wiring length, and therefore improves speeding up of readout, miniaturization of the solid-state imaging element 110, and the like.

Further, while not depicted in FIG. 8, the Cu terminal 114 may be formed on only either one of the wafers, and the Cu terminal 114 on the other wafer may be eliminated from the position facing the formed Cu terminal 114 to form the oxide film joining layer 115 not having the Cu terminal 114, and achieve joining between the Cu terminal 114 and the oxide film joining layer 115.

In this case, it is necessary that the one Cu terminal 114 and the other Cu terminal 114 are so provided as to face each other for a purpose of electric connection. However, there may be such a case which forms only the one Cu terminal 114 and eliminates the other Cu terminal 114 from the facing position to form only an insulation film joining layer 115 for a different reason. In this case, not electric connection but physical joining is achievable between the solid-state imaging element 110 and the semiconductor elements 120 and 130.

Subsequently, as depicted in FIG. 9, the silicon layers 122 and 132 of the semiconductor elements 120 and 130 are polished and flattened at lower surfaces thereof by CMP or the like to be made thinner.

Thereafter, as depicted in FIG. 10, the protection film 140 is formed on a non-lamination portion of the oxide film joining layer 115 as the lamination surface of the solid-state imaging element 110 on the side where the semiconductor element 120 is laminated, and on the entire surface including peripheral side surfaces of the silicon layers 122 and 132 of the semiconductor elements 120 and 130 on the side opposite to the lamination surface.

As previously described, the protection film 140 is a protection film which protects the lower surface of the wiring layer 111 of the solid-state imaging element 110 from over-etching during etching from the lower part of the oxide film 150 for forming the clearance 151. Moreover, the protection film 140 is a film for preventing diffusion of metal from the wiring layer 111.

For example, the protection film 140 includes silicon nitride ($Si_3N_4$).

Figure 11:
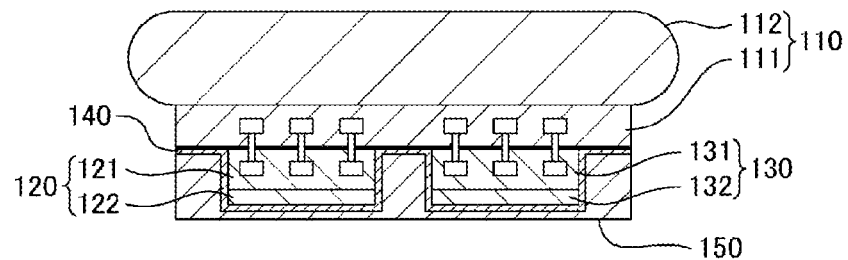
FIG. 11 is an explanatory diagram of the manufacturing method of the solid-state imaging device according to the first embodiment of the present disclosure (4).

Subsequently, the solid-state imaging element 110 and the semiconductor elements 120 and 130 joined and integrated with each other are heated to an oxide film forming temperature. As a result, the oxide film 150 is formed on the lower surfaces of the solid-state imaging element 110 and the semiconductor elements 120 and 130 as depicted in FIG. 11. In this manner, the semiconductor elements 120 and 130 are covered with the oxide film 150. The oxide film 150 thus formed is flattened by CMP or the like as depicted in the present figure.

Figure 12:
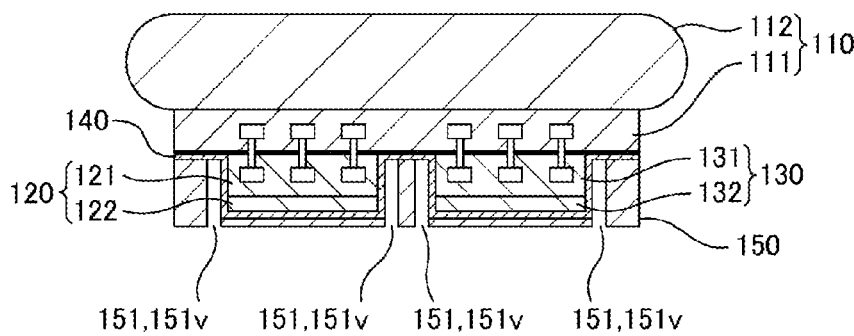
FIG. 12 is an explanatory diagram of the manufacturing method of the solid-state imaging device according to the first embodiment of the present disclosure (5).

Subsequently, as depicted in FIG. 12, a predetermined width of the oxide film 150 on each of the peripheral side surfaces of the semiconductor elements 120 and 130 is removed by dry etching or the like. By removing the oxide film 150 in this manner, each of the clearances 151 surrounding the peripheral side surfaces of the semiconductor elements 120 and 130 via the protection film 140 is formed as depicted in FIG. 5B.

Figure 13:
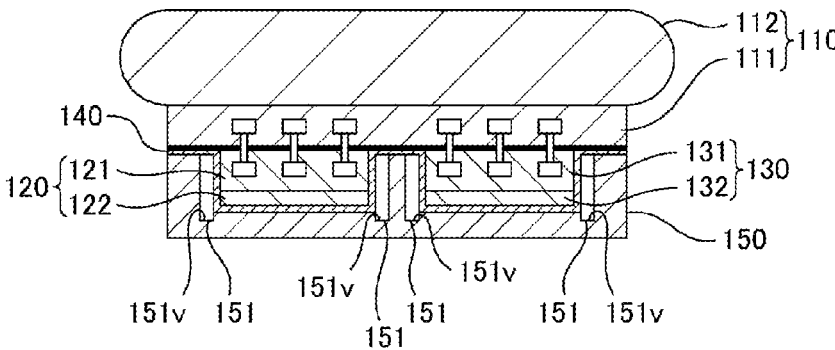
FIG. 13 is an explanatory diagram of the manufacturing method of the solid-state imaging device according to the first embodiment of the present disclosure (6).

Subsequently, the solid-state imaging element 110 and the semiconductor elements 120 and 130 integrated with each other are again heated to an oxide film forming temperature. As a result, an oxide film 150 is further formed on the oxide film 150 where the clearances 151 are formed. In this manner, openings 151v of the clearances 151 are covered to form closed spaces surrounding the respective peripheral side surfaces of the semiconductor elements 120 and 130 as depicted in FIG. 13. Moreover, the oxide film 150 covering the openings 151v of the clearances 151 is flattened by CMP or the like.

Figure 14:
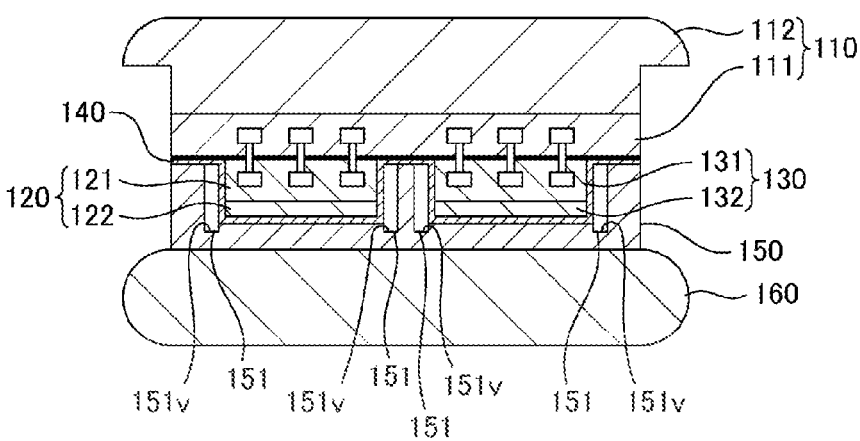
FIG. 14 is an explanatory diagram of the manufacturing method of the solid-state imaging device according to the first embodiment of the present disclosure (7).

Subsequently, as depicted in FIG. 14, the support substrate 160 is joined by oxide film joining to the flattened oxide film 150 covering the openings 151v of the clearances 151.

Subsequently, as depicted in FIG. 15, the silicon layer 112 of the solid-state imaging element 110 is made thinner by CMP or the like. In addition, the color filter 171 and the micro-lens array 170 are mounted. Thereafter, singulation and packaging are carried out to complete the solid-state imaging device 100.

The manufacturing method of the solid-state imaging device 100 according to the first embodiment of the present disclosure has the foregoing steps. Accordingly, this configuration can reduce tensile stress produced in the state where the oxide film 150 covers the solid-state imaging element 110 and the semiconductor element 120, and allows transistors to be provided near chip ends. This configuration reduces a chip size of the semiconductor element 120, and therefore achieves cost reduction. This configuration further reduces a warp.

3. Solid-State Imaging Device According to Second Embodiment of Present Disclosure FIG. 16A is a side cross-sectional diagram of the solid-state imaging device 100 according to a second embodiment of the present disclosure, while FIG. 16B is a cross-sectional diagram taken along an X-X position. The second embodiment is chiefly different from the first embodiment in a point that the protection film 140 is formed only on the non-lamination portion of the oxide film joining layer 115 which is the lamination surface of the solid-state imaging element 110 on the side where the semiconductor element 120 is laminated, and is not formed on the peripheral side surface and the lower surface of the semiconductor element 120 as depicted in FIGS. 16A and 16B.

This structure can be produced by removing the protection film 140 formed on the peripheral side surface and the lower surface of the semiconductor element 120, when the clearance 151 is formed by dry etching or the like. Alternatively, the protection film 140 may be formed only on the non-lamination portion of the oxide film joining layer 115 which is the lamination surface of the solid-state imaging element 110 on the side where the semiconductor element 120 is laminated in the manufacturing step of the first embodiment.

This configuration can reduce an entire thickness of the solid-state imaging device 100, thereby achieving thickness reduction of the package and cost reduction.

4. Solid-State Imaging Device According to Third Embodiment of Present Disclosure FIG. 17A is a side cross-sectional diagram of the solid-state imaging device 100 according to a third embodiment of the present disclosure, while FIG. 17B is a cross-sectional diagram taken along an X-X position. The third embodiment is chiefly different from the first embodiment in a point that the opening 151v of the clearance 151 is not covered by the protection film 140 as depicted in FIGS. 17A and 17B. Specifically, the opening 151v of the clearance 151 is in direct contact with the support substrate 160.

This structure can be produced by eliminating the step of covering the opening 151v of the clearance 151 with the oxide film 150 as depicted in FIG. 13.

This configuration eliminates the step of covering the opening 151v of the clearance 151 with the oxide film 150 in the manufacturing step of the first embodiment. Accordingly, shortening of the manufacturing step and improvement of a yield, and therefore cost reduction can be achieved.

5. Solid-State Imaging Device According to Fourth Embodiment of Present Disclosure FIG. 18A is a side cross-sectional diagram of the solid-state imaging device 100 according to a fourth embodiment of the present disclosure, while FIG. 18B is a cross-sectional diagram taken along an X-X position. The fourth embodiment is chiefly different from the first embodiment in a point that the protection film 140 is not formed on the lower surface of the semiconductor element 120 as depicted in FIGS. 18A and 18B.

This structure can be produced by deeply polishing the oxide film 150 covering the opening 151v of the clearance 151 during flattening by CMP of the like. Alternatively, this structure can be produced by forming the oxide film 150 covering the opening 151v of the clearance 151 into a thin film, and polishing the oxide film 150. Instead, this structure can be produced by eliminating the step of covering the opening 151v of the clearance 151 with the oxide film 150 and performing polishing without covering by the oxide film 150 as in the third embodiment.

Each of these configurations can reduce the number of manufacturing steps and decrease the entire thickness of the solid-state imaging device 100, thereby achieving thickness reduction of the package and cost reduction. Moreover, the silicon layer 122 of the semiconductor element 120 and the support substrate 160 are joined to each other by semiconductor direct joining without interposition of the oxide film 150. Accordingly, heat generated from the solid-state imaging element 110 and the semiconductor element 120 is easily conducted to the support substrate 160.

Figures 19A, 19B, 20A, 20B, 21A, 21B, 22A, 22B:
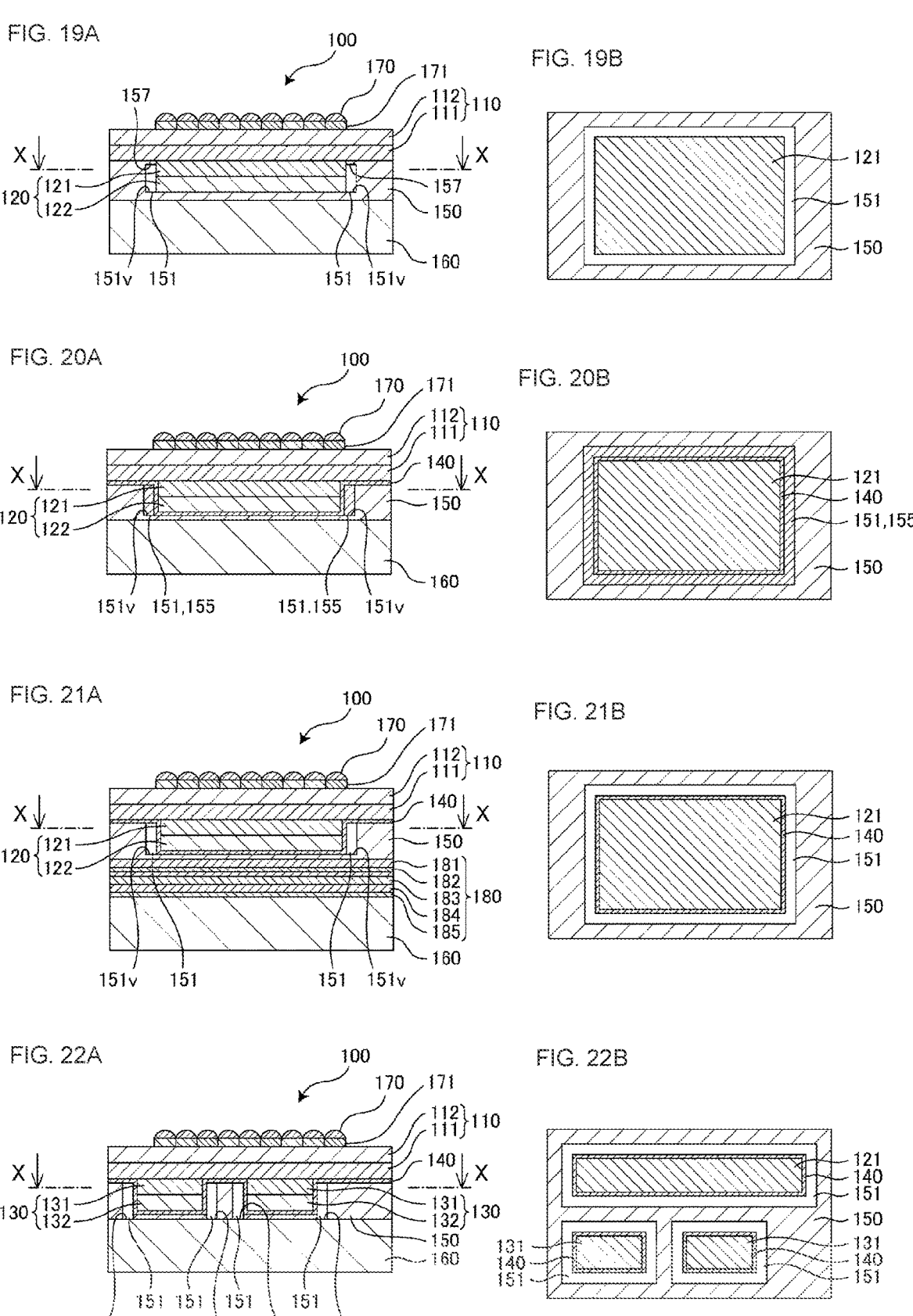
FIGS. 19A and 19B are explanatory diagrams of a configuration example of a solid-state imaging device according to a fifth embodiment of the present disclosure.
FIGS. 20A and 20B are explanatory diagrams of a configuration example of a solid-state imaging device according to a sixth embodiment of the present disclosure.
FIGS. 21A and 21B are explanatory diagrams of a configuration example of a solid-state imaging device according to a seventh embodiment of the present disclosure.
FIGS. 22A and 22B are explanatory diagrams of a configuration example of a solid-state imaging device according to an eighth embodiment of the present disclosure.

6. Solid-State Imaging Device According to Fifth Embodiment of Present Disclosure FIG. 19A is a side cross-sectional diagram of the solid-state imaging device 100 according to a fifth embodiment of the present disclosure, while FIG. 19B is a cross-sectional diagram taken along an X-X position. The fifth embodiment is chiefly different from the first embodiment in a point that the protection film 140 is not formed, and a point that a thin oxide film 157 is formed between an upper end of the clearance 151 and a lower surface of the wiring layer 111 of the solid-state imaging device 100 as depicted in FIGS. 19A and 19B.

This structure can be produced by eliminating the step of forming the protection film 140 as described with reference to FIG. 10, forming and flattening the oxide film 150 as described with reference to FIG. 11, forming the thin oxide film 157 between the clearance 151 formed by dry etching as described with reference to FIG. 12 and the lower surface of the wiring layer 111 of the solid-state imaging device 100, and covering the opening 151v of the clearance 151 with the oxide film 150 and flattening the oxide film 150 as described with reference to FIG. 13.

The protection film 140 is chiefly provided for preventing over-etching. Accordingly, elimination of the protection film 140 does not directly influence the characteristics of the solid-state imaging device 100. However, it is necessary to appropriately control the step of forming the oxide film 157 in such a manner as not to form an excessively deep clearance as the clearance 151. Specifically, this configuration can eliminate the step of forming the protection film 140, by appropriately controlling the step of forming the clearance 151, thereby achieving cost reduction.

7. Solid-State Imaging Device According to Sixth Embodiment of Present Disclosure FIG. 20A is a side cross-sectional diagram of the solid-state imaging device 100 according to a sixth embodiment of the present disclosure, while FIG. 20B is a cross-sectional diagram taken along an X-X position. The sixth embodiment is chiefly different from the first embodiment in a point that the clearance 151 is filled with the buffer film 155 as depicted in FIGS. 20A and 20B.

This structure can be produced by forming the clearance 151 by dry etching or the like as described with reference to FIG. 12, subsequently filling the clearance 151 with the buffer film 155, and covering the opening 151v of the clearance 151 with the oxide film 150 and flattening the oxide film 150 as described with reference to FIG. 13. The buffer film 155 herein includes silicon dioxide ($SiO_2$), silicon nitride ($Si_3N_4$), silicon carbide (SiC), copper (Cu), aluminum (Al), or carbon (C) each of which has a low Young's modulus and is porous and used as a low-k material, for example.

Moreover, the buffer film 155 may include a material capable of forming a film at a low temperature, such as an organic material forming an organic film.

Note that the low-k material is a material having low permittivity and used as an interlayer dielectric material ("k" refers to permittivity ε in electromagnetism). It has become a remarkable problem that miniaturization of integrated circuit wiring increases capacitance between wires and produces a signal delay, and therefore increases power consumption. For solving this problem, the low-k material capable of lowering capacitance between wires is adopted.

The clearance 151 is provided to reduce tensile stress produced when the semiconductor element 120 is cooled in the state of being covered with the oxide film 150. Accordingly, the tensile stress can be reduced by filling the clearance 151 with the buffer film 155, and the buffer film 155 thus formed does not influence the characteristics of the solid-state imaging device 100. Moreover, the buffer film 155 filling the clearance 151 can improve insulation properties, and reduce occurrence of a signal delay in comparison with the insulation layer of the oxide film 150.

Furthermore, the material capable of forming a film at a low temperature eliminates a necessity of performing a heating step, and therefore achieves cost reduction.

8. Solid-State Imaging Device According to Seventh Embodiment of Present Disclosure FIG. 21A is a side cross-sectional diagram of the solid-state imaging device 100 according to a seventh embodiment of the present disclosure, while FIG. 21B is a cross-sectional diagram taken along an X-X position. The seventh embodiment is chiefly different from the first embodiment in a point that, as depicted in FIGS. 21A and 21B, a heat conduction film 180 is formed between the support substrate 160 and the oxide film 150 that covers the opening 151v of the clearance 151 and that is flattened as described with reference to FIG. 13. The heat conduction film 180 may contain a heat dissipation member such as silicon carbide (SIC), aluminum nitride (AlN), silicon nitride ($Si_3N_4$), copper (Cu), aluminum (Al), and carbon (C).

This structure can be produced by forming the heat conduction film 180 on the lower surface of the oxide film 150 that covers the opening 151v of the clearance 151 and that is flattened as described with reference to FIG. 13, and joining the support substrate 160 to the heat conduction film 180. Alternatively, this structure can be produced by joining the support substrate 160, to which the heat conduction film 180 formed beforehand has been joined, to the lower surface of the oxide film 150 that covers the opening 151v of the clearance 151 and that is flattened.

The heat conduction film 180 is not limited to a film having one layer and may be a film having any number of layers. For example, as depicted in FIG. 21A, multiple heat conduction films 181 to 185 may be laminated to constitute multiple layers. In addition, a different material may be used for each of the layers.

The heat conduction film 180 formed between the oxide film 150 and the support substrate 160 can conduct heat to the support substrate 160 and improve heat dissipation as well as stress reduction. Moreover, the heat conduction film 180 functioning as a heat spreader can reduce a temperature increase of the solid-state imaging device 100.

9. Solid-State Imaging Device According to Eighth Embodiment of Present Disclosure FIG. 22A is a side cross-sectional diagram of the solid-state imaging device 100 according to an eighth embodiment of the present disclosure, while FIG. 22B is a cross-sectional diagram taken along an X-X position. The eighth embodiment is chiefly different from the first embodiment in a point that three different types of chips in total, i.e., the one semiconductor element 120 and the two semiconductor elements 130, are provided on the solid-state imaging element 110 in the horizontal direction and joined to the solid-state imaging element 110 as depicted in FIGS. 22A and 22B. Moreover, each of the openings 151v of the clearances 151 may be either covered by the protection film 140, or not covered as depicted in FIGS. 17A and 17B.

The step of joining the one semiconductor element 120 and the two semiconductor elements 130 to the solid-state imaging element 110 to manufacture the solid-state imaging device 100 in this manner is similar to the step described above with reference to FIGS. 6 to 15.

Note that the number of the semiconductor elements 120 and 130 joined to the solid-state imaging element 110 is not limited to three in total as depicted in FIGS. 22A and 22B and may be more than three.

The configuration allowing joining of the two or more semiconductor elements 120 and 130 to the solid-state imaging element 110 achieves high-density mounting, and thus achieves size reduction, cost reduction, and high functionality of the solid-state imaging device 100.

10. Solid-State Imaging Device According to Ninth Embodiment of Present Disclosure FIG. 23A is a side cross-sectional diagram of the solid-state imaging device 100 according to a ninth embodiment of the present disclosure, while FIG. 23B is a cross-sectional diagram taken along an X-X position. The ninth embodiment is chiefly different from the first embodiment in a point that three different types of chips in total, i.e., the one semiconductor element 120 and the two semiconductor elements 130, are provided on the solid-state imaging element 110 in the horizontal direction and joined to the solid-state imaging element 110 as depicted in FIGS. 23A and 23B. Moreover, the ninth embodiment is chiefly different from the eighth embodiment in a point that only the one clearance 151 is formed between the semiconductor element 120 and the semiconductor element 130 as depicted in the present figure.

The step of joining the one semiconductor element 120 and the two semiconductor elements 130 to the solid-state imaging element 110 to manufacture the solid-state imaging device 100 in this manner is similar to the step described above with reference to FIGS. 6 to 15.

Moreover, elimination of the necessity of forming the two clearances 151 between the semiconductor element 120 and the semiconductor elements 130 can decrease the number of steps. Furthermore, the configuration requiring only the one clearance 151 can reduce the space between the semiconductor element 120 and the semiconductor elements 130. Accordingly, this configuration achieves high density and size reduction, and also cost reduction of the solid-state imaging device 100.

11. Solid-State Imaging Device According to Tenth Embodiment of Present Disclosure FIG. 24 is a side cross-sectional diagram of the solid-state imaging device 100 according to a tenth embodiment of the present disclosure. The tenth embodiment is chiefly different from the first embodiment in a point that multiple semiconductor elements 120a, 120b, 120c, and up to 120n are laminated in the vertical direction and joined to the solid-state imaging element 110 to form multiple layers in the present figure. Note that the present figure does not depict the protection film 140.

This multilayered structure can be produced by repeating the steps described above with reference to FIGS. 6 to 13 for the solid-state imaging element 110 a predetermined number of times. Note that the protection film 140 may be formed on the entire lower surface for every joining of the semiconductor elements 120a, 120b, 120c, and up to 120n. Moreover, lamination of the layers in the vertical direction may be achieved by any one of the first embodiment to the ninth embodiment described above or by a method combined with a twelfth embodiment described below. Further, connection between the respective layers can be achieved by forming a TSV or by Cu—Cu connection.

According to the present embodiment, the multiple layers of the semiconductor elements 120 are joined to the solid-state imaging element 110 to form a three-dimensional configuration. Accordingly, high density and size reduction of the solid-state imaging device 100 can be achieved without increasing an external size in the planar view. While described above with reference to FIG. 24 has been the example where the multiple layers of the semiconductor elements 120 are joined in the vertical direction to form the three-dimensional configuration, multiple layers of the semiconductor elements 130 may be joined in the vertical direction to form a three-dimensional configuration. Moreover, the semiconductor elements 120 and 130 may appropriately be combined, and multiple layers of the semiconductor elements 120 and 130 may be joined in the vertical direction to form a three-dimensional configuration. Furthermore, the semiconductor elements 120 and 130 in any one of the first embodiment to the ninth embodiment may appropriately be combined, and multiple layers of the semiconductor elements 120 and 130 may be joined in the vertical direction to form a three-dimensional configuration.

12. Solid-State Imaging Device According to Eleventh Embodiment of Present Disclosure FIG. 25 is a side cross-sectional diagram of the solid-state imaging device 100 according to an eleventh embodiment of the present disclosure. The eleventh embodiment is chiefly different from the first embodiment in a point that multiple semiconductor elements 120a, 120b, 120c, and up to 120n are joined in the vertical direction to the solid-state imaging element 110 to form multiple layers in the present figure. Moreover, the eleventh embodiment is chiefly different from the tenth embodiment in the following point. While clearances 151a, 151b, 151c, and up to 151n are formed in the respective layers in the tenth embodiment, only one clearance 151 is formed through the layers of the semiconductor elements 120 in the eleventh embodiment as depicted in the present figure. The eleventh embodiment is similar to the tenth embodiment other than this point. Note that the present figure does not depict the protection film 140.

This multilayered structure can be produced by sequentially laminating the semiconductor elements 120a, 120b, 120c, and up to 120n-1 to form multiple layers, joining the final semiconductor element 120n, then forming the clearance 151, covering the opening 151v of the clearance 151 with the oxide film 150, and joining the support substrate 160 in the steps of the respective layers illustrated in FIG. 6 to FIG. 13 described above. Further, connection between the respective layers can be achieved by forming a TSV, or by Cu—Cu connection.

According to the present embodiment, the step of forming the clearance 151 as described with reference to FIGS. 12 and 13 need not be carried out for each of the layers unlike the tenth embodiment. Accordingly, the structure can be simplified, and high density and size reduction of the solid-state imaging device 100 can be achieved without increasing the external size in the planar view. Moreover, cost reduction is achievable.

13. Solid-State Imaging Device According to Twelfth Embodiment of Present Disclosure

Basic Form of Twelfth Embodiment

The present embodiment relates to a cross-sectional shape of the clearance 151 and others. The cross-sectional shape of the basic form of the clearance 151 is a substantially rectangular shape as depicted in FIG. 1A.

Modification 1 of Twelfth Embodiment

Figure 26:
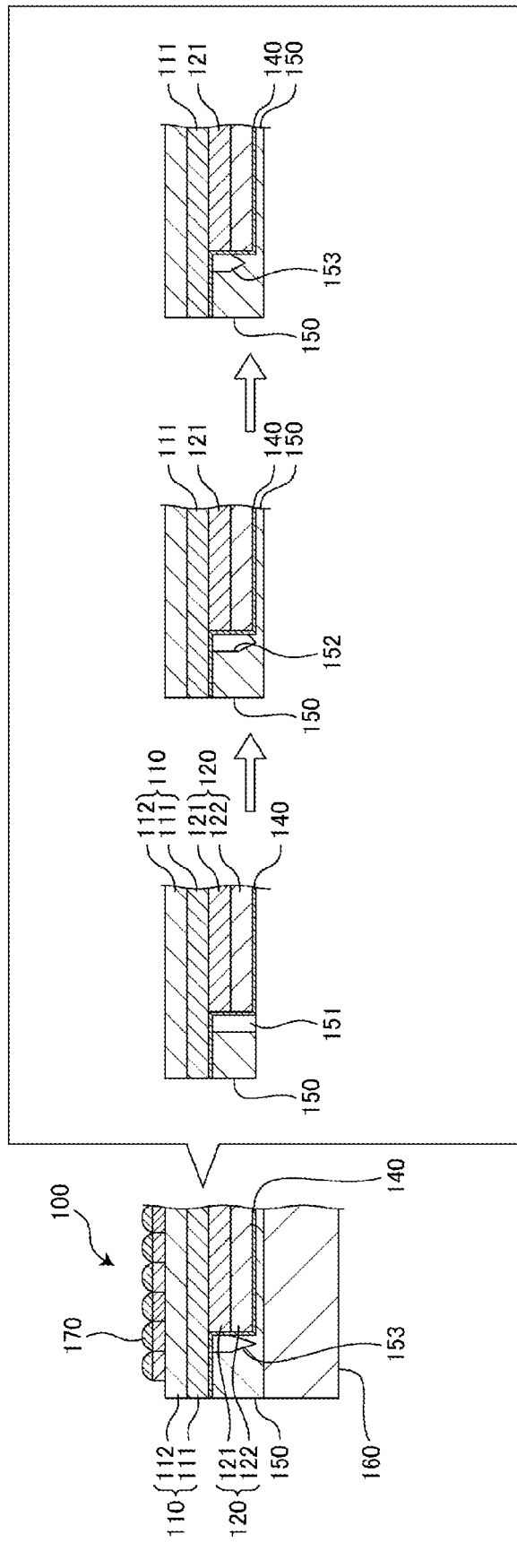
FIG. 26 is an explanatory diagram of a configuration example of a solid-state imaging device according to a twelfth embodiment of the present disclosure (1).

FIG. 26 is a side cross-sectional diagram of the solid-state imaging device 100 according to a modification 1 of the twelfth embodiment of the present disclosure. As depicted in a left end illustration outside a frame in the present figure, a cross-sectional shape of a clearance 153 of the present modification 1 has a lower half having a substantially V shape. As depicted in a left end illustration inside the frame in the present figure, it is originally preferable that the cross-sectional shape of the clearance 153 be a substantially rectangular shape.

According to the present modification 1, the oxide film 150 reaches a portion near the opening 151*v* of a clearance 152 and forms the substantially V shape of the lower half as depicted in a central illustration inside the frame of FIG. 26 in the step of covering the opening 151*v* of the clearance 151 with the oxide film 150 depicted in FIG. 13. However, this configuration does not influence the effect of reducing tensile stress. Accordingly, the clearance 151 may have this shape.

Moreover, a large quantity of the oxide film 150 reaches a portion near the opening 151*v* of a clearance 153 and forms the substantially V shape of the lower half as depicted in a right end illustration inside the frame of the present figure in the step of covering the opening 151*v* of the clearance 151 with the oxide film 150 depicted in FIG. 13. Similarly to above, this configuration does not influence the effect of reducing tensile stress. Accordingly, the clearance 151 may have this shape.

Modification 2 of Twelfth Embodiment

Figure 27:
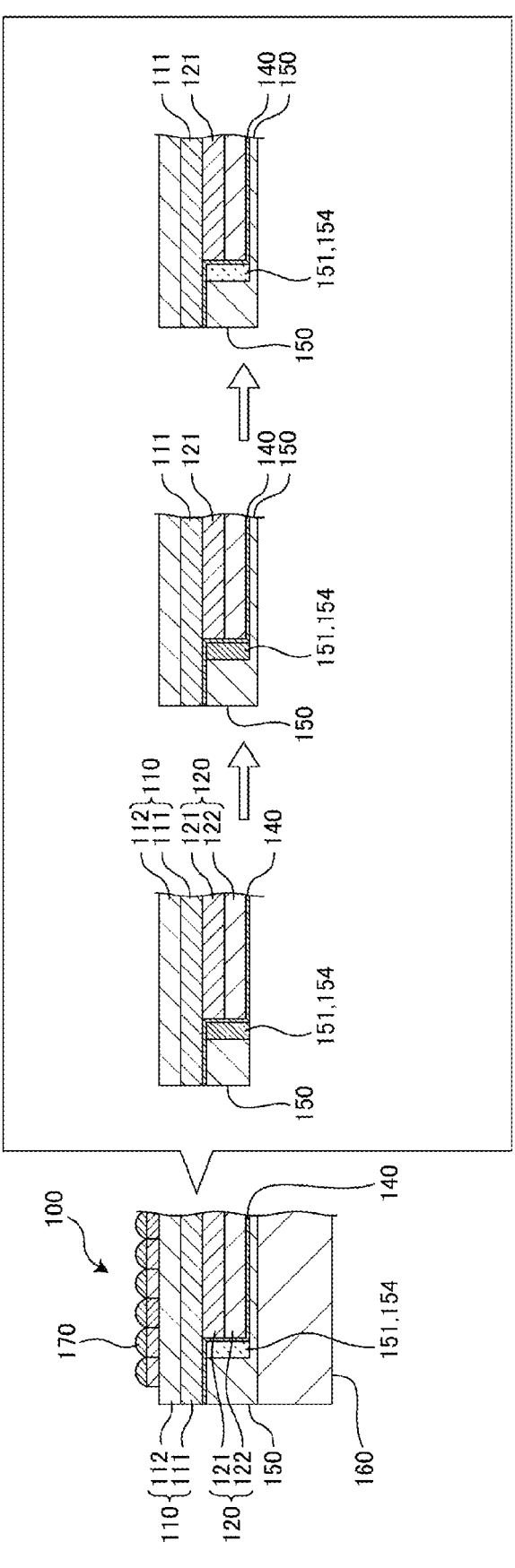
FIG. 27 is an explanatory diagram of a configuration example of the solid-state imaging device according to the twelfth embodiment of the present disclosure (2).

FIG. 27 is a side cross-sectional diagram of the solid-state imaging device 100 according to a modification 2 of the twelfth embodiment of the present disclosure. As depicted in a left end illustration outside a frame in the present figure, a cross-sectional shape of the clearance 151 of the present modification 2 is a substantially rectangular shape, and the clearance 151 has a part of a temporary filling film 154 left inside the clearance 151.

According to the present modification 2, the clearance 151 is formed as depicted in FIG. 12, and then the temporary filling film 154 is formed within the clearance 151 as depicted in a left end illustration inside the frame of the present figure. Subsequently, as depicted in a central illustration inside the frame of FIG. 27, the opening 151*v* of the clearance 151 is covered with the oxide film 150 as depicted in FIG. 13. Thereafter, as depicted in a right end illustration inside the frame of FIG. 27, the temporary filling film 154 is removed from the clearance 151 by a wetting process. Removal of the temporary filling film 154 by the wetting process is achievable by forming a small hole through dry processing.

However, the temporary filling film 154 is not required to be removed in whole and may be left in part. Moreover, in a case where the temporary filling film 154 includes a material capable of forming a film at a low temperature or having a low Young's modulus, the temporary filling film 154 may be left without removal. In this case, the present embodiment is performed in a manner similar to that of the sixth embodiment.

Even when a part of the temporary filling film 154 is left within the clearance 151, the left part of the temporary filling film 154 does not influence the effect of reducing tensile stress. Accordingly, the clearance 151 may have this shape.

Modification 3 of Twelfth Embodiment

FIG. 28 is a side cross-sectional diagram of the solid-state imaging device 100 according to a modification 3 of the twelfth embodiment of the present disclosure. As depicted in a left end illustration outside a frame in the present figure, a cross-sectional shape of the clearance 151 of the present modification 3 is a substantially rectangular shape, and an oxide film 156 is formed between the clearance 151 and the semiconductor element 120.

According to the present modification 3, as depicted in a left end illustration inside the frame of FIG. 28, the oxide film 156 as a thin film is formed between the clearance 151 and the semiconductor element 120 when the clearance 151 having a predetermined width is formed by dry etching or the like as depicted in FIG. 12.

Moreover, as depicted in a central illustration inside the frame of FIG. 28, in a case where the peripheral side surface of the semiconductor element 120 has an inverse tapered shape, the oxide film 156 is formed between the clearance 151 and the semiconductor element 120. This shape can be formed by slightly shifting the position of removal of the oxide film 150 by dry etching or the like from the semiconductor element 120.

Even if the oxide film 150 is formed between the clearance 151 and the semiconductor element 120, this configuration does not influence the effect of reducing tensile stress. Accordingly, the clearance 151 may have this shape. Moreover, this manner of dry etching can prevent a risk of over-etching of the peripheral side surface of the semiconductor element 120. Accordingly, reduction of a processing loss and cost reduction can be achieved.

Furthermore, as depicted in a right end illustration inside the frame of the present figure, the clearance 151 may have a thin shape. For example, assuming that a depth (height) of the clearance 151 is h, and that a width of the clearance 151 is v, an aspect ratio of the clearance 151 is only required to be $v/h = \frac{1}{50}$ or higher. The clearance 151 is provided to reduce tensile stress. Accordingly, the width v may be any value as long as a predetermined depth can be secured. Specifically, for reducing tensile stress, only a small crack is required to be formed between the peripheral side surface of the semiconductor element 120 and the oxide film 150. However, a small crack is difficult to form by industrial processing. Accordingly, it is only required that the aspect ratio be $v/h = \frac{1}{50}$ or higher in view of processing. This aspect ratio eliminates a necessity of special processing for forming the clearance 151. Accordingly, cost reduction is achievable.

14. Electronic Apparatus Including Solid-State Imaging Device According to Present Disclosure Described with reference to FIG. 29 will be a configuration example of an electronic apparatus including any one of the solid-state imaging devices 100 according to the first embodiment to the twelfth embodiment described above.

The solid-state imaging device 100 is applicable to electronic apparatuses in general each including the solid-state imaging device 100 as an image pickup unit (photoelectric conversion unit), such as an imaging device like a digital still camera or a video camera, a portable terminal device having an imaging function, and a copying machine including the solid-state imaging device 100 as an image reading unit. The solid-state imaging device 100 may have a one-chip form, or a module-shaped form having an imaging function as a package collectively including an imaging unit and a signal processing unit or an optical system.

Figure 29:
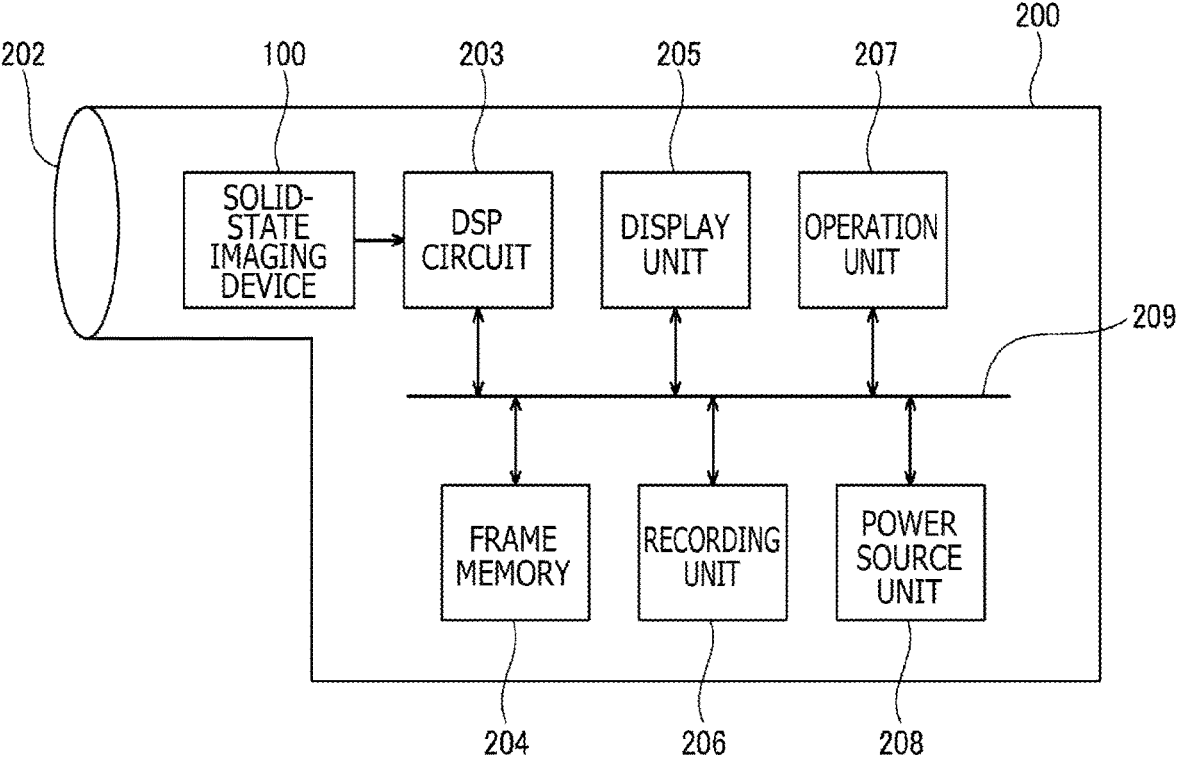
FIG. 29 is a block diagram of an electronic apparatus including the solid-state imaging device according to the present disclosure.

As depicted in FIG. 29, an imaging device 200 as an electronic apparatus includes an optical unit 202, the solid-state imaging device 100, a DSP (Digital Signal Processor) circuit 203 which is a camera signal processing circuit, a frame memory 204, a display unit 205, a recording unit 206, an operation unit 207, and a power source unit 208. The DSP circuit 203, the frame memory 204, the display unit 205, the recording unit 206, the operation unit 207, and the power source unit 208 are connected to one another via a bus line 209.

The optical unit 202 includes multiple lenses and captures incident light (image light) coming from a subject, to form an image of the incident light on a pixel region (not depicted) of the solid-state imaging device 100. After the image of the incident light is formed on the pixel region by the optical unit 202, the solid-state imaging device 100 converts light quantities of the incident light into electric signals for each pixel and outputs the electric signals as pixel signals.

For example, the display unit 205 includes a panel-type display device such as a liquid crystal panel and an organic EL (Electro Luminescence) panel and displays moving images or still images captured by the solid-state imaging device 100. The recording unit 206 records the moving images or the still images captured by the solid-state imaging device 100 in a recording medium such as a hard disk and a semiconductor memory.

The operation unit 207 issues operation commands associated with various functions of the imaging device 200 under operation by a user. The power source unit 208 appropriately supplies various types of power sources corresponding to operation power sources for the DSP circuit 203, the frame memory 204, the display unit 205, the recording unit 206, and the operation unit 207 to these supply targets.

According to the present disclosure described above, the imaging device 200 and other electronic apparatuses each including the solid-state imaging device 100 of the present disclosure become highly integrated and low-cost apparatuses.

Lastly, the respective embodiments described above are presented only as examples of the present disclosure. It is not intended that the present disclosure be limited to the above embodiments. Accordingly, in addition to the respective embodiments described above, it is obvious that various modifications may be made in accordance with designs and the like without departing from the technical ideas of the present disclosure. Moreover, advantageous effects to be offered are not limited to those described in the present description as mere examples. In addition, other advantageous effects may be produced.

Note that the present technology can also have the following configurations.

(1)

A solid-state imaging device including:

a solid-state imaging element;

a semiconductor element laminated on the solid-state imaging element and electrically connected to the solid-state imaging element; and a covering film that covers a non-lamination portion that is a region where the semiconductor element is not laminated, in a laminated surface of the solid-state imaging element where the semiconductor element is laminated, and further covers a peripheral side surface of the semiconductor element and forms a clearance between the peripheral side surface of the semiconductor element and the covering film.

(2)

The solid-state imaging device according to (1) above, including:

a protection film on the non-lamination portion of the solid-state imaging element and on an entire surface including the peripheral side surface of the semiconductor element on a side opposite to a lamination surface.

(3)

The solid-state imaging device according to (1) above, including:

a protection film on the non-lamination portion of the solid-state imaging element.

(4)

The solid-state imaging device according to (1) above, including:

a protection film on the non-lamination portion of the solid-state imaging element and on the peripheral side surface of the semiconductor element.

(5)

The solid-state imaging device according to (1) to (4) above, in which electric connection between the solid-state imaging element and the semiconductor element includes Cu—Cu connection.

(6)

The solid-state imaging device according to any one of (1) to (3) and (5) above, in which a support substrate is joined via the covering film to a non-light receiving side of the laminated solid-state imaging element and semiconductor element.

(7)

The solid-state imaging device according to (5) or (6) above, in which joining between the covering film and the support substrate includes semiconductor direct joining.

(8)

The solid-state imaging device according to (1), (5), or (6) above, in which the clearance formed in the covering film makes contact with a support substrate.

(9)

The solid-state imaging device according to (1) or (5) above, in which the clearance formed in the covering film includes a thin oxide film between an upper end of the clearance and a lower surface of a wiring layer of the solid-state imaging element.

(10)

The solid-state imaging device according to (1) or (5) above, in which the clearance formed in the covering film has a substantially rectangular cross section.

(11)

The solid-state imaging device according to (1) or (5) above, in which the clearance formed in the covering film has a substantially V-shaped cross section.

(12)

The solid-state imaging device according to (1) or (5) above, in which a thin film of the covering film is formed between the clearance and the protection film.

(13)

The solid-state imaging device according to (1) or (5) above, in which the clearance formed in the covering film has an aspect ratio of $1/50$ or higher.

(14)

The solid-state imaging device according to (1) or (5) above, in which the clearance formed in the covering film is filled with a film formable at a low temperature or a film having a low Young's modulus.

(15)

The solid-state imaging device according to (14) above, in which the film formable at a low temperature includes an organic film.

(16)

The solid-state imaging device according to (14) above, in which the film having a low Young's modulus includes a film that contains at least any one of silicon dioxide ($SiO_2$), silicon nitride ($Si_3N_4$), silicon carbide (SiC), copper (Cu), aluminum (Al), or carbon (C) each of which is porous and used as a low-k material, or includes an organic film.

(17)

The solid-state imaging device according to (1) or (5) above, in which two or more of the semiconductor elements are provided on a lower surface of the solid-state imaging element in a horizontal direction.

(18)

The solid-state imaging device according to (17) above, in which the two or more semiconductor elements provided in the horizontal direction has the one clearance between the semiconductor elements.

(19)

The solid-state imaging device according to (1) or (5) above, in which two or more of the semiconductor elements are laminated in a vertical direction on a lower surface of the solid-state imaging element.

(20)

The solid-state imaging device according to (19) above, in which the clearance is formed on an entire peripheral side surface of the two or more semiconductor elements laminated in the vertical direction.

(21)

The solid-state imaging device according to (1) or (5) above, in which the covering film includes an inorganic oxide film or an organic film.

(22)

The solid-state imaging device according to (1) or (5) above, in which a heat dissipation member having predetermined heat conductivity is laminated on a non-light receiving side of the semiconductor element via the covering film.

(23)

The solid-state imaging device according to (22) above, in which the heat dissipation member contains at least any one of silicon carbide (SIC), aluminum nitride (AlN), silicon nitride ($Si_3N_4$), copper (Cu), aluminum (Al), or carbon (C).

(24)

A manufacturing method of a solid-state imaging device, the method including:

a step of joining a wiring layer of a solid-state imaging element and a wiring layer of a semiconductor element and electrically connecting the respective wiring layers;

a step of thinning a silicon layer of the semiconductor element;

a step of forming a protection film on a non-lamination portion that is a region where the semiconductor element is not laminated, in a laminated surface of the solid-state imaging element where the semiconductor element is laminated, and on a surface including a peripheral side surface of the semiconductor element on a side opposite to a lamination surface;

a step of covering the protection film with a covering film and flattening the covering film;

a step of removing the covering film on the peripheral side surface of the semiconductor element to form a clearance;

a step of covering an opening of the clearance with a covering film and flattening the covering film;

a step of joining a support substrate to the covering film; and a step of carrying out packaging.

(25)

The manufacturing method of the solid-state imaging device according to (24) above, in which the step of covering the opening of the clearance with the covering film and flattening the covering film includes a step of forming a temporary filling film within the clearance after formation of the clearance, and a step of removing the temporary filling film and a step of flattening the covering film after the opening of the clearance is covered with the covering film.

(26)

An electronic apparatus including:

a solid-state imaging device that includes a solid-state imaging element, a semiconductor element laminated on the solid-state imaging element and electrically connected to the solid-state imaging element, and a covering film that covers a non-lamination portion that is a region where the semiconductor element is not laminated, in a laminated surface of the solid-state imaging element where the semiconductor element is laminated, and further covers a peripheral side surface of the semiconductor element and forms a clearance between the peripheral side surface of the semiconductor element and the covering film.

REFERENCE SIGNS LIST

100: Solid-state imaging device
101: Wafer
102: Wafer
110: Solid-state imaging element
111: Wiring layer
112: Silicon layer
113: Wiring pattern
114: Cu terminal
115: Oxide film joining layer
120: Semiconductor element
120a to 120n: Semiconductor element
121: Wiring layer
122: Silicon layer
123: Wiring pattern
130: Semiconductor element
131: Wiring layer
132: Silicon layer
133: Wiring pattern
140: Protection film
150: Oxide film
151: Clearance
151a to 151n: Clearance
151v: Opening
152: Clearance
153: Clearance
154: Temporary filling film
155: Buffer film
156: Oxide film
157: Oxide film
160: Support substrate 170: Micro-lens array
171: Color filter
180 to 185: Heat conduction film
200: Imaging device

The invention claimed is:

1. A solid-state imaging device, comprising:
a solid-state imaging element;
a semiconductor element laminated on the solid-state imaging element and electrically connected to the solid-state imaging element; and
a covering film that covers a non-lamination portion that is a region where the semiconductor element is not laminated, in a laminated surface of the solid-state imaging element where the semiconductor element is laminated, and further covers a peripheral side surface of the semiconductor element and forms a clearance between the peripheral side surface of the semiconductor element and the covering film.

2. The solid-state imaging device according to claim 1, further comprising:
a protection film on the non-lamination portion of the solid-state imaging element and on an entire surface including the peripheral side surface of the semiconductor element on a side opposite to a lamination surface.

3. The solid-state imaging device according to claim 1, further comprising:
a protection film on the non-lamination portion of the solid-state imaging element.

4. The solid-state imaging device according to claim 1, further comprising:
a protection film on the non-lamination portion of the solid-state imaging element and on the peripheral side surface of the semiconductor element.

5. The solid-state imaging device according to claim 1, wherein electric connection between the solid-state imaging element and the semiconductor element includes Cu—Cu connection.

6. The solid-state imaging device according to claim 1, wherein a support substrate is joined via the covering film to a non-light receiving side of the laminated solid-state imaging element and the semiconductor element.

7. The solid-state imaging device according to claim 6, wherein joining between the covering film and the support substrate includes semiconductor direct joining.

8. The solid-state imaging device according to claim 1, wherein the clearance formed in the covering film makes contact with a support substrate.

9. The solid-state imaging device according to claim 1, wherein the clearance formed in the covering film includes a thin oxide film between an upper end of the clearance and a lower surface of a wiring layer of the solid-state imaging element.

10. The solid-state imaging device according to claim 1, wherein the clearance formed in the covering film has a substantially rectangular cross section.

11. The solid-state imaging device according to claim 1, wherein the clearance formed in the covering film has a substantially V-shaped cross section.

12. The solid-state imaging device according to claim 1, wherein a thin film of the covering film is formed between the clearance and the protection film.

13. The solid-state imaging device according to claim 1, wherein the clearance formed in the covering film has an aspect ratio of 1/50 or higher.

14. The solid-state imaging device according to claim 1, wherein the clearance formed in the covering film is filled with a film formable at a low temperature or a film having a low Young's modulus.

15. The solid-state imaging device according to claim 14, wherein the film formable at the low temperature includes an organic film.

16. The solid-state imaging device according to claim 14, wherein the film having the low Young's modulus includes a film that contains at least one of silicon dioxide ($SiO_2$), silicon nitride ($Si_3N_4$), silicon carbide (SiC), copper (Cu), aluminum (Al), or carbon (C) each of which is porous and used as a low-k material, or includes an organic film.

17. The solid-state imaging device according to claim 1, wherein two or more semiconductor elements are provided on a lower surface of the solid-state imaging element in a horizontal direction.

18. The solid-state imaging device according to claim 17, wherein the two or more semiconductor elements provided in the horizontal direction has the clearance between the semiconductor elements.

19. The solid-state imaging device according to claim 1, wherein two or more semiconductor elements are laminated in a vertical direction on a lower surface of the solid-state imaging element.

20. The solid-state imaging device according to claim 19, wherein the clearance is formed on an entire peripheral side surface of the two or more semiconductor elements laminated in the vertical direction.

21. The solid-state imaging device according to claim 1, wherein the covering film includes an inorganic oxide film or an organic film.

22. The solid-state imaging device according to claim 1, wherein a heat dissipation member having predetermined heat conductivity is laminated on a non-light receiving side of the semiconductor element via the covering film.

23. The solid-state imaging device according to claim 22, wherein the heat dissipation member contains at least one of silicon carbide (SIC), aluminum nitride (AlN), silicon nitride ($Si_3N_4$), copper (Cu), aluminum (Al), or carbon (C).

24. A manufacturing method of a solid-state imaging device, the manufacturing method comprising:
joining a wiring layer of a solid-state imaging element and a wiring layer of a semiconductor element and electrically connecting the wiring layer of the solid-state imaging element and the wiring layer of a semiconductor element;
thinning a silicon layer of the semiconductor element;
forming a protection film on a non-lamination portion that is a region where the semiconductor element is not laminated, in a laminated surface of the solid-state imaging element where the semiconductor element is laminated, and on a surface including a peripheral side surface of the semiconductor element on a side opposite to a lamination surface;
covering the protection film with a covering film and flattening the covering film;
removing the covering film on the peripheral side surface of the semiconductor element to form a clearance;
covering an opening of the clearance with the covering film and flattening the covering film;
joining a support substrate to the covering film; and
carrying out packaging.

25. The manufacturing method of the solid-state imaging device according to claim 24, wherein the covering the opening of the clearance with the covering film and the flattening the covering film include forming a temporary filling film within the clearance after formation of the clearance, and removing the temporary filling film and flattening the covering film after the opening of the clearance is covered with the covering film.

26. An electronic apparatus comprising:

a solid-state imaging device that includes a solid-state imaging element, a semiconductor element laminated on the solid-state imaging element and electrically connected to the solid-state imaging element, and a covering film that covers a non-lamination portion that is a region where the semiconductor element is not laminated, in a laminated surface of the solid-state imaging element where the semiconductor element is laminated, and further covers a peripheral side surface of the semiconductor element and forms a clearance between the peripheral side surface of the semiconductor element and the covering film.

* * * * *